United States Patent [19]

May

[11] 4,283,847
[45] Aug. 18, 1981

[54] CIRCUIT BOARD ASSEMBLY

[75] Inventor: Gordon M. May, Cedar Springs, Mich.

[73] Assignee: Lear Siegler, Inc., Santa Monica, Calif.

[21] Appl. No.: 42,139

[22] Filed: May 24, 1979

[51] Int. Cl.³ .......................... H05K 3/30; B23P 19/00
[52] U.S. Cl. ........................................ 29/832; 29/741; 29/742; 29/744
[58] Field of Search ................. 29/564, 741, 742, 430, 29/33 K, 743, 792, 718, 739, 711; 427/123; 198/690, 366, 617, 679, 403, 381; 174/68.5; 140/105; 219/85 R

[56] References Cited

U.S. PATENT DOCUMENTS

| | | |
|---|---|---|
| 3,092,237 | 6/1963 | Miller . |
| 3,465,408 | 9/1969 | Clark et al. . |
| 3,492,713 | 2/1970 | White . |
| 3,564,691 | 2/1971 | Ackerman . |
| 3,629,543 | 12/1971 | Mayhew ............................ 219/85 R |
| 3,692,168 | 9/1972 | Hughes, Jr. et al. ............ 198/690 X |
| 3,727,284 | 4/1973 | Ragard et al. . |
| 3,760,484 | 9/1973 | Kowalski . |
| 3,793,710 | 2/1974 | Monahan et al. . |
| 3,796,201 | 3/1974 | Golub ............................ 140/105 X |
| 3,917,054 | 11/1975 | Hurst ............................ 198/690 X |
| 3,973,322 | 8/1976 | Boynton ............................ 29/741 X |
| 4,063,347 | 12/1977 | Woodman, Jr. . |

*Primary Examiner*—Ervin M. Combs
*Assistant Examiner*—C. J. Arbes
*Attorney, Agent, or Firm*—John E. McGarry; Richard A. Gaffin

[57] ABSTRACT

An apparatus and method for assembling integrated circuits to a printed circuit board wherein integrated circuits with protective carriers are selectively dispensed from a rotary magazine, are removed from the carriers and positioned by the leads on magnetic holders on a continuous conveyor which moves the integrated circuits, thus mounted on the holders, to a lead-forming and trim assembly wherein the leads are bent downwardly and outwardly to form feet and trimmed. Thereafter the integrated circuits are moved, thus mounted on the holders, to a flux-applying assembly wherein flux is applied to the lead feet, then to a solder-applying assembly wherein solder is applied to the lead feet, and then to a program activated X-Y axis table which mounts the printed circuit board. The integrated circuits, with tinned leads, are transferred through magnetic fingers to the printed circuit board wherein electrodes solder the leads to pads on the Board. The leads are bent in a special configuration comprising four bends which assist in positioning the leads on the magnetic holder and enhances the vibrational stress resistance of the integrated circuits on the assembled printed circuit board. Special universal tooling is magnetically held on the X-Y axis table to mount the printed circuit boards in precise location on the table. The entire operation from dispensing to soldering is computer controlled.

38 Claims, 33 Drawing Figures

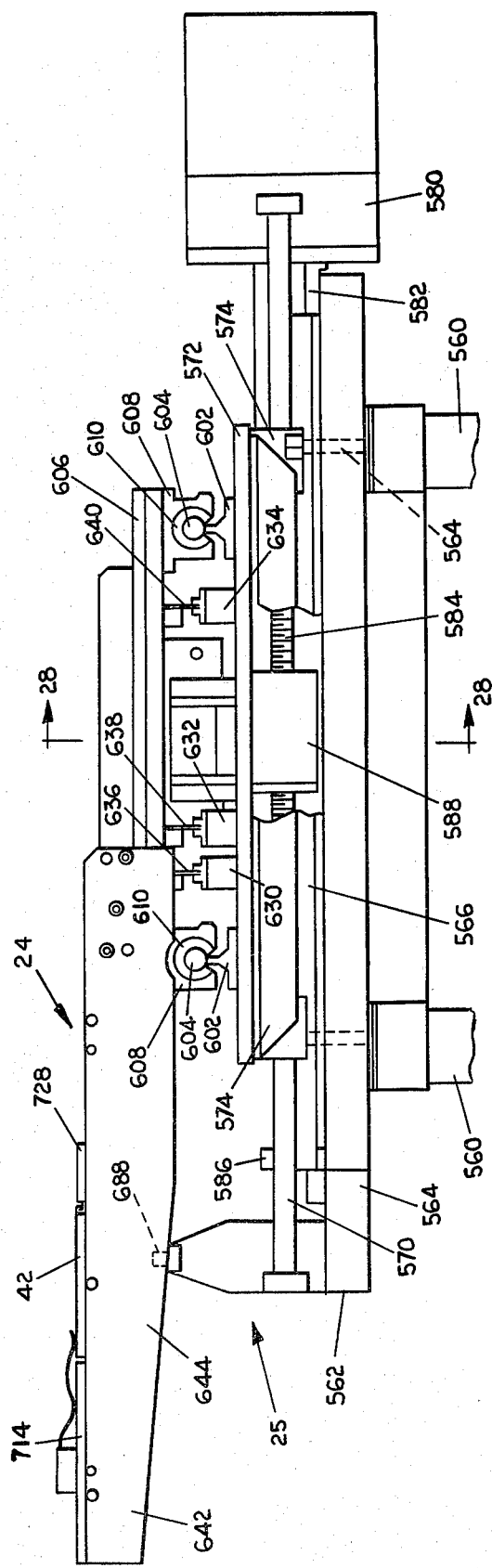
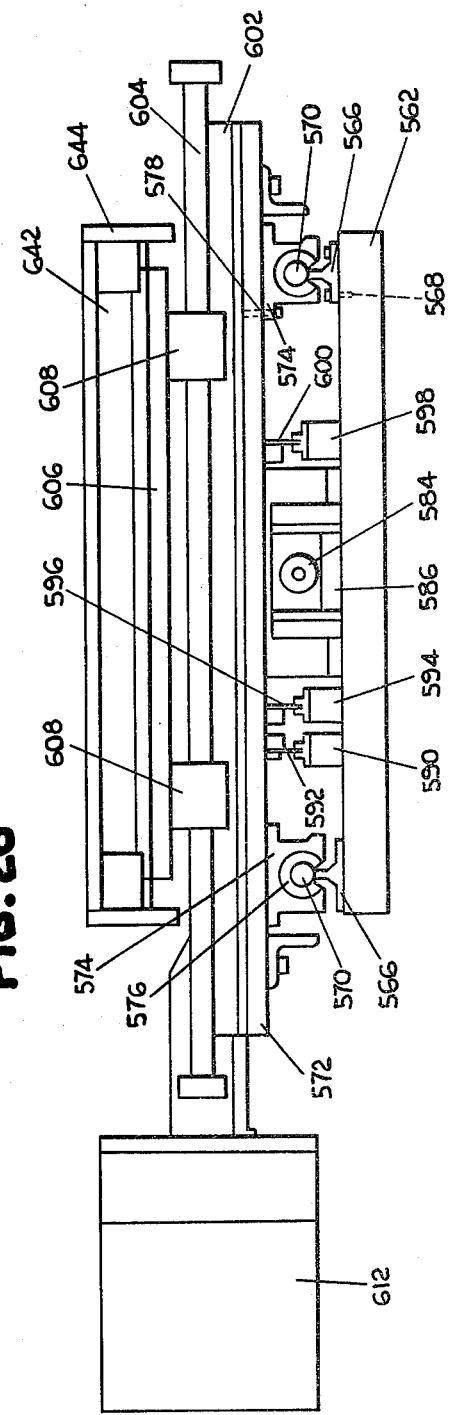
FIG. 26
FIG. 27

CIRCUIT BOARD ASSEMBLY

BACKGROUND OF THE INVENTION

1. Field of the Invention

This invention relates to assembly of integrated circuits, preferably flat pack integrated circuits, to a printed circuit board. In one of its aspects, the invention relates to a completely automated method and apparatus for mounting integrated circuits on a printed circuit board wherein the integrated circuits are loaded into the apparatus as they come from the manufacturer.

2. State of the Prior Art

Printed circuit boards have up to fifty or more integrated circuits soldered thereto in a predetermined relationship. The integrated circuits have a number of leads which are formed with feet and through which the integrated circuits are soldered to the board. Prior art techniques for bonding beam-type integrated circuits to circuit boards are described in the U.S. patent to Monahan et al U.S. Pat. No. 3,793,710 (issued Feb. 26, 1974). These techniques usually involve visual alignment of the integrated circuits on the board using a microscope.

Techniques for mounting dual in-line integrated circuits to printed circuit boards are disclosed in the United States patent to Kowalski U.S. Pat. No. 3,760,484 (issued Sept. 25, 1973); Ragard et al U.S. Pat. No. 3,727,284 (issued Apr. 17, 1973); and Woodman, Jr. U.S. Pat. No. 4,063,347 (issued Dec. 20, 1977). Each of these prior art machines positions the leads of the integrated circuits through holes in the printed circuit board in an automated technique. The leads must be previously tinned and bent into proper orientation before loading into the machines.

Another prior art machine for assembling beam-type integrated circuits takes flat pack assemblies including a carrier from a single dispensing channel and removes the carrier. The integrated circuits are then moved on a rotary table to a lead-forming die by a suction means wherein the leads are bent downwardly and outwardly of the body to form pad-engaging feet. The integrated circuits are picked up by the body through suction means on the rotary table and thereafter transferred to an X-Y axis table wherein the integrated circuits are positioned in an approximate desirable location on the table. The table is programmed by a controller and moved to a predetermined location for the particular integrated circuit. However, the transfer technique is not sufficiently precise enough and the bodies of the integrated circuits vary such that precise location of the integrated circuits on the board can not be accomplished with this machine. Accordingly, an operator, who views the integrated circuit position through a microscope, must manually "jog" or move the integrated circuit to the precise location. Thereafter solder electrodes are moved into position and solder the leads to the board.

This machine requires pretinning of the leads. Thus, the integrated circuits must be removed from the carrier, tinned and then replaced in the carriers before loading into the machine. This process sometimes results in distortion of the leads and further creates an extra handling step. The positioning of the integrated circuits on the printed circuit board by the operator considerably slows down the process. Further, the operator must be careful to load the multitude of integrated circuits, typically 72 circuits, into the magazine in the precise order. Loading the magazines in the improper order can result in one or more integrated circuits mounted in improper locations on the printed circuit board.

SUMMARY OF THE INVENTION

The invention relates to a method and apparatus for assembling integrated circuits on a printed circuit board in a machine wherein a printed circuit board is mounted on a movable table. Electrode means solder the integrated circuit leads to the printed circuit board at a predetermined location on the table, means position the integrated circuits on the printed circuit board at a predetermined location for soldering and means intermittently move the table with respect to the electrode means to position different areas of the printed circuit board at the predetermined location beneath the electrode means. According to the invention, a continuous conveyor is mounted on a frame and has a plurality of spaced support means to support and retain integrated circuits by the leads thereof. Means dispense the integrated circuits seriatim onto the integrated circuit support means so that each integrated circuit is supported on a support means by its leads. A bending means is mounted on the frame adjacent the conveyor means for bending the leads downwardly and outwardly to form feet while the leads are supported on the integrated circuit support means. The leads are also coated with solder while the integrated circuits are retained by the integrated circuit support means and the thus tinned integrated circuits are transferred directly from the integrated circuit support means to the printed circuit board in a predetermined location for soldering by the electrode means. The continuous conveyor is moved intermittently so that the integrated circuit support means moves sequentially from the dispensing means to the lead-forming means, to the solder-coating means and then to the transferring means.

The integrated circuit dispensing means comprises a carriage rotatably mounted on the frame and a plurality of channels adapted to receive the integrated circuits, preferably in assembly form with the carrier, as the integrated circuit is received from the manufacturer. Each of the channels contains a different type of integrated circuit. Means are provided for coordinating the rotation of the carriage to dispense a different integrated circuit from each of the channels with the placement of the different integrated circuits at a particular location on the printed circuit board on the table. The dispensing means further has means to separate the integrated circuits from the carriage.

Preferably, means are provided to detect the orientation of the integrated circuit prior to placement of the integrated circuit on the support means. An alarm signal is generated by the orientation detecting means if the integrated circuit is not oriented in a preselected orientation.

The integrated circuit support means comprises a U-shaped channel made of a magnetized material so that the ends of the U are spaced to receive the integrated circuit body therebetween with the integrated circuit leads supported thereon. In this manner, the integrated circuit leads are magnetically retained by the U-shaped supports.

The conveyor is trained around sprockets having horizontal axes, thereby forming an upper and lower run. The dispensing means is positioned at the upper run and positions the integrated circuits upside down on the U-shaped supports. The solder-coating means is positioned beneath the lower run to coat the leads as the integrated circuits pass right side up along the lower run of the conveyor. The solder-coating means is provided typically by a liquid solder fountain which is pumped into the path of the leads.

Desirably, a flux-coating means is also provided in the path of the integrated circuit leads upstream of the solder-coating means but also on the lower run of the conveyor. In a preferred embodiment of the invention, the solder is pumped in a direction countercurrent to the movement of the leads to prevent solder buildup between the leads.

The integrated circuit positioning means is positioned also on the lower run of the conveyor but downstream of the solder-coating means. In a preferred embodiment, a pair of magnetic fingers are reciprocally mounted for movement from above the leads on the U-shaped supports to a position in close proximity to the circuit board table to strip the integrated circuits from the U-shaped support means and carry the integrated circuits, magnetically supported by the fingers, down to the table. Electrode means strip the integrated circuit from the fingers and solder the leads to the circuit board. At the same time, the magnetic stripping fingers are returned to the retracted position so that the conveyor can index to another position. Desirably, a timed pulse of air is applied to the electrodes subsequent to a heating cycle to cool the electrode and thereby cool the weld.

The table comprises an electromagnetic holding means and a ferromagnetic means for holding the circuit boards on the table. The ferromagnetic holding means comprises at least two separate support members having a pin for engaging a locating hole in the circuit board. A support is further provided for engaging an edge of the circuit board. Thus, the circuit board is supported at one edge by a support and at two other positions by pin-locating supports.

In order to counteract the force of the electrodes on the circuit board, an anvil support means is mounted beneath the circuit board in contact therewith. The anvil support means is reciprocally mounted to move away from the board subsequent to the soldering operations so that the board can be moved to a new location without interference from the anvil support means.

The lead bending means has means to form four bends in each of the leads. The leads are bent upwardly, laterally, downwardly and then laterally of the body of the integrated circuit by the bending means. By so doing, the integrated circuits mounted on the printed circuit board, have three bends which function as stress relief points. The leads are further trimmed at the bending means as they are being bent. Means are provided for removing trimmed ends of the leads from the bending means and from the trimming means.

Further according to the invention, a method of assembling flat pack integrated circuits onto a circuit board comprises the steps of dispensing of the flat packs seriatim, gripping the flat packs by the leads thereof and, while thus gripped by the leads, bending the leads downwardly and outwardly to form feet for mounting the integrated circuits to the circuit boards, and applying solder to the feet. Thereafter, the leads are soldered to pads on the circuit boards. The leads are magnetically gripped during the lead-bending and soldering steps and are magnetically gripped as the leads are transferred to the printed circuit board. Further, the method according to the invention comprises the step of applying flux to the integrated circuit leads while they are being gripped and prior to the solder-applying step.

BRIEF DESCRIPTION OF THE DRAWINGS

The invention will now be described with reference to the accompanying drawings in which:

FIG. 26 is an enlarged side elevational view of the X-Y table;

FIG. 27 is an enlarged front view of the X-Y table;

DESCRIPTION OF THE PREFERRED EMBODIMENT

General

Figure 1:
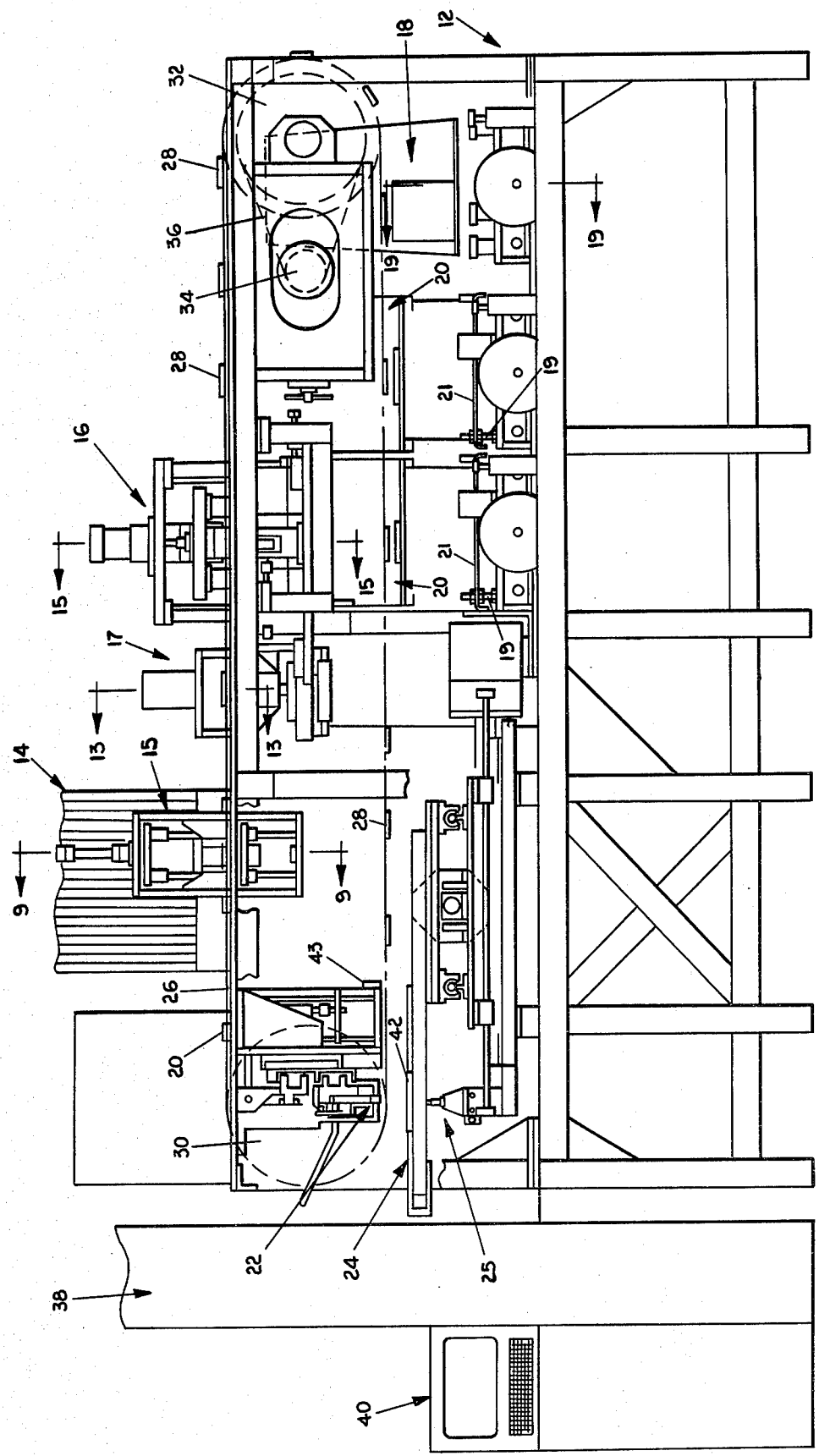
FIG. 1 is a side elevational view of circuit board assembly machine according to the invention.
Figure 2:
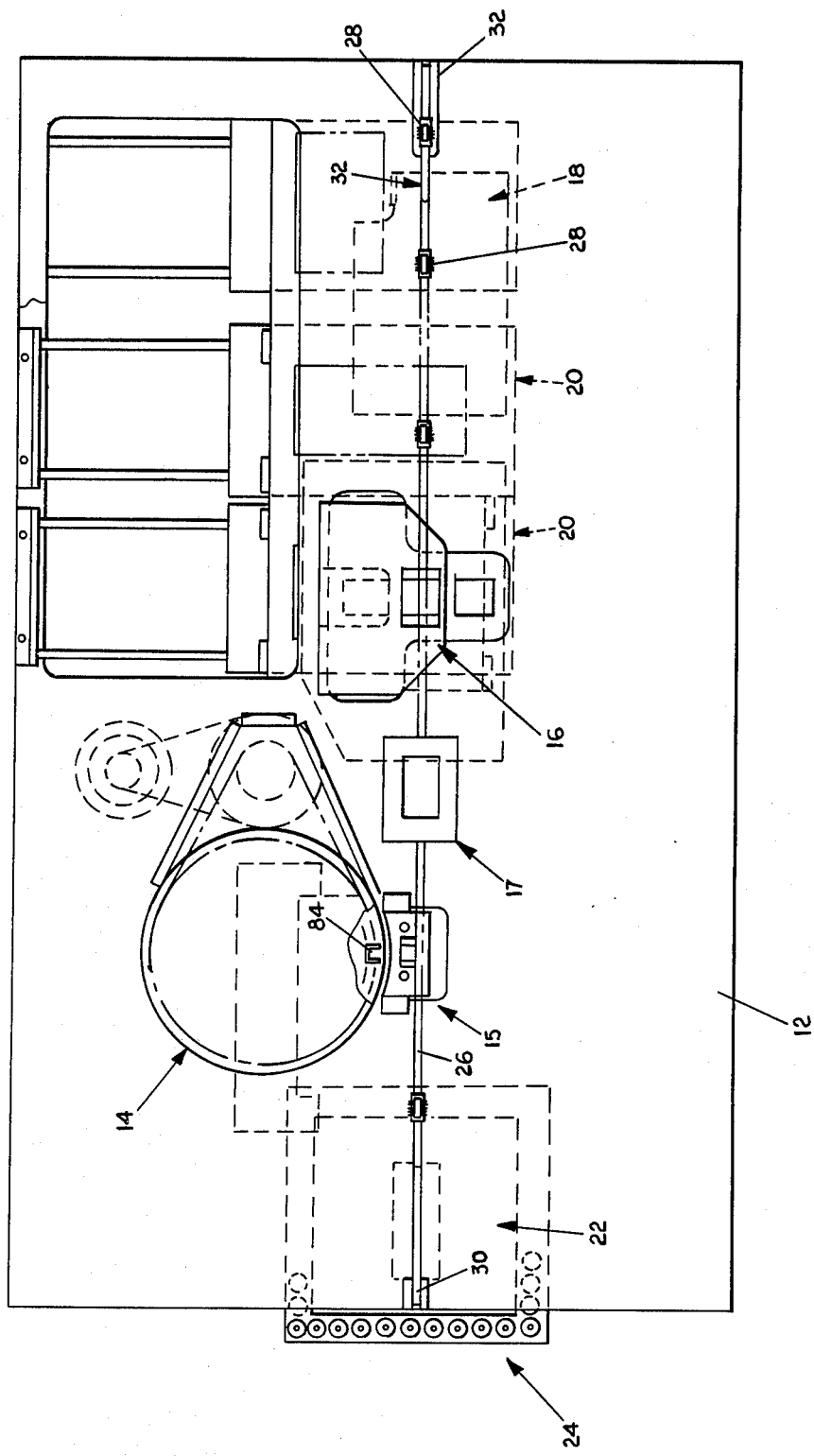
FIG. 2 is a plan view of the machine illustrated in FIG. 1.
Figure 3:
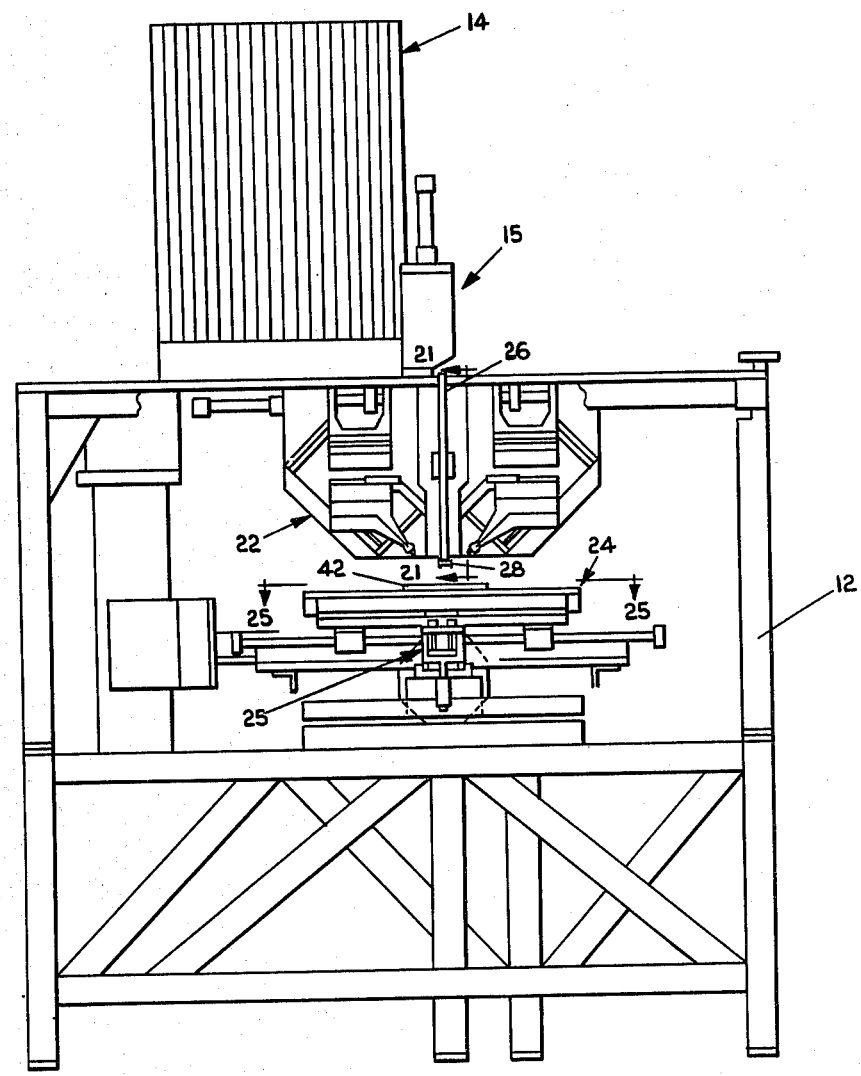
FIG. 3 is an end view of the apparatus illustrated in FIGS. 1 and 2.

Referring now to the drawings and to FIGS. 1 through 3 in particular, there is shown a circuit board assembly machine having a three-dimensional, rectangular frame 12. A sequencer assembly 14 is mounted on top of the frame and a decapper assembly 15 is mounted adjacent the sequencer to receive integrated circuit (IC) flat pack assemblies. A centering assembly 17 is positioned alongside the decapper 15 to center the IC flat pack on a steel continuous conveyor belt 26. A lead-forming and trim assembly 16 is positioned adjacent to the centering assembly 17 to trim leads on the integrated circuits and to form the leads into a suitable shape. A flux assembly 18 is mounted within the frame beneath the top thereof for applying flux to the leads of the integrated circuits. Two solder assemblies 20 are positioned adjacent to the flux assembly 18 to provide solder to the leads of the integrated circuits. An integrated circuit remover and reflux solder assembly 22 is positioned at one end of the frame 12 to remove the integrated circuits from the conveyor belt 26 and transfer them to an X-Y table assembly 24. The conveyor belt 26 has fifteen precisely spaced magnetic holders 28 and is mounted on sprockets 30 and 32 for an upper and lower run. Sprocket 32 is intermittently driven by a motor 34 through a drive belt 36. A computer control unit 38 controls the operation of each of the functions of the machine and is connected to a CRT display and keyboard unit 40 through which the machine can be monitored and controlled. A printed circuit board 42 is positioned on the X-Y table to receive the IC flat packs. A circuit board support assembly 25 is mounted beneath the X-Y table and provides a vertically reciprocable support to counteract the force of reflow solder electrodes in the IC remover and reflow solder assembly. The presence of an integrated circuit on the magnetic holders 28 is detected by a fiber optic reflective scanner 43 which is mounted on the housing frame for the reflow solder assembly 22. The scanner detects the leads of the flat packs as they pass by and generates a signal representative thereof. The detected signal is supplied to the control unit 38.

Briefly, IC flat packs assemblies are mounted in vertical rows in sequencer 14 in upside down condition. The sequencer 14 rotates about a vertical axis. Different flat packs are selected from various parts of the sequencer 14 and are dispensed seriatim to the decapper unit 15 which removes the caps and carriers from the flat packs and positions the IC flat packs onto the magnetic holders 28 on the conveyor belt 26 in upside down condition. The conveyor 26 then moves the integrated circuits in intermittent fashion to the centering assembly 17 where the integrated circuits are centered on the holders. The integrated circuits are then moved to the lead-forming and trim assembly 16 wherein the leads are formed into a desired shape with feet for mounting on the circuit board and trimmed to an appropriate size. The integrated circuits are then carried around the sprocket 32 and pass through the flux assembly 18 and the solder assemblies 20 beneath the conveyor belt, but in right side up condition. As previously mentioned, flux and solder are applied to the leads of the integrated circuits as they pass through these three assemblies. The flux and solder assemblies are offset from the rest positions of the magnetic holders 28 so that the IC leads do not dwell in the flux and solder pots while the conveyor belt 26 is stopped. The first solder assembly 20 encountered by the IC leads is at a higher temperature to assure maximum solder migration onto the leads. The second solder assembly is at a lower temperature for maximum solder thickness on the leads. The integrated circuits are removed from the magnetic holders 28 at the IC remover and reflux solder assemblies 22 and are moved vertically downwardly into a selected location on an integrated circuit board 42 on the X-Y table assembly 24. The remover and reflux solder assembly 22 contains electrical heating means to heat the solder on the leads of the integrated circuits and to thereby solder the integrated circuits to the circuit board 42. The X-Y table 24 is then moved to its new location and another integrated circuit is positioned thereon.

In the event an IC flat pack is not present on the holder 28 as it approaches the IC remover and reflow solder assembly 22, the control unit 38 will call for the appropriate IC from the sequencer 14, and that IC will then be appropriately positioned on the printed circuit board when it finally arrives at the IC remover and reflow solder assembly 22.

Flat Pack Assembly

Figure 4:
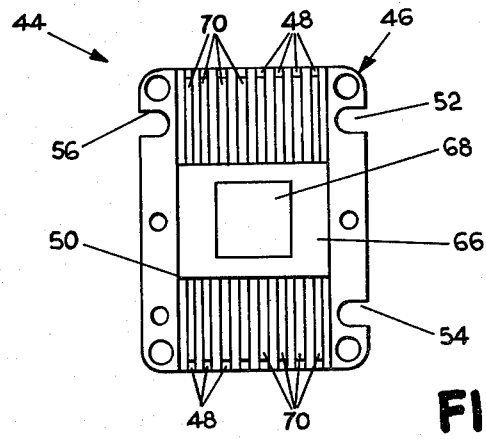
FIG. 4 is a plan view of an integrated circuit flat pack and protective plastic carrier.

Reference is now made to FIG. 4 for a description of the flat pack and integrated circuit. An integrated circuit flat pack assembly 44 is shown in plan view in FIG. 4 and comprises a molded plastic carrier 46 having elongated indentations 48 and a cross-indentation 50 at a central portion thereof. Orientation side indentations 52 and 54 are formed in one side of the carrier 46 and a single orientation side indentation 56 is positioned at an opposite side of the carrier opposite the indentation 52. A cap 66 is positioned in the indentations 50 and the carrier 46 and retains in the carrier an integrated circuit 68 having leads 70 which are positioned in the elongated carrier indentations 48. The integrated circuit flat pack is conventional and by itself no part of this invention.

Sequencer Assembly

Figure 5:
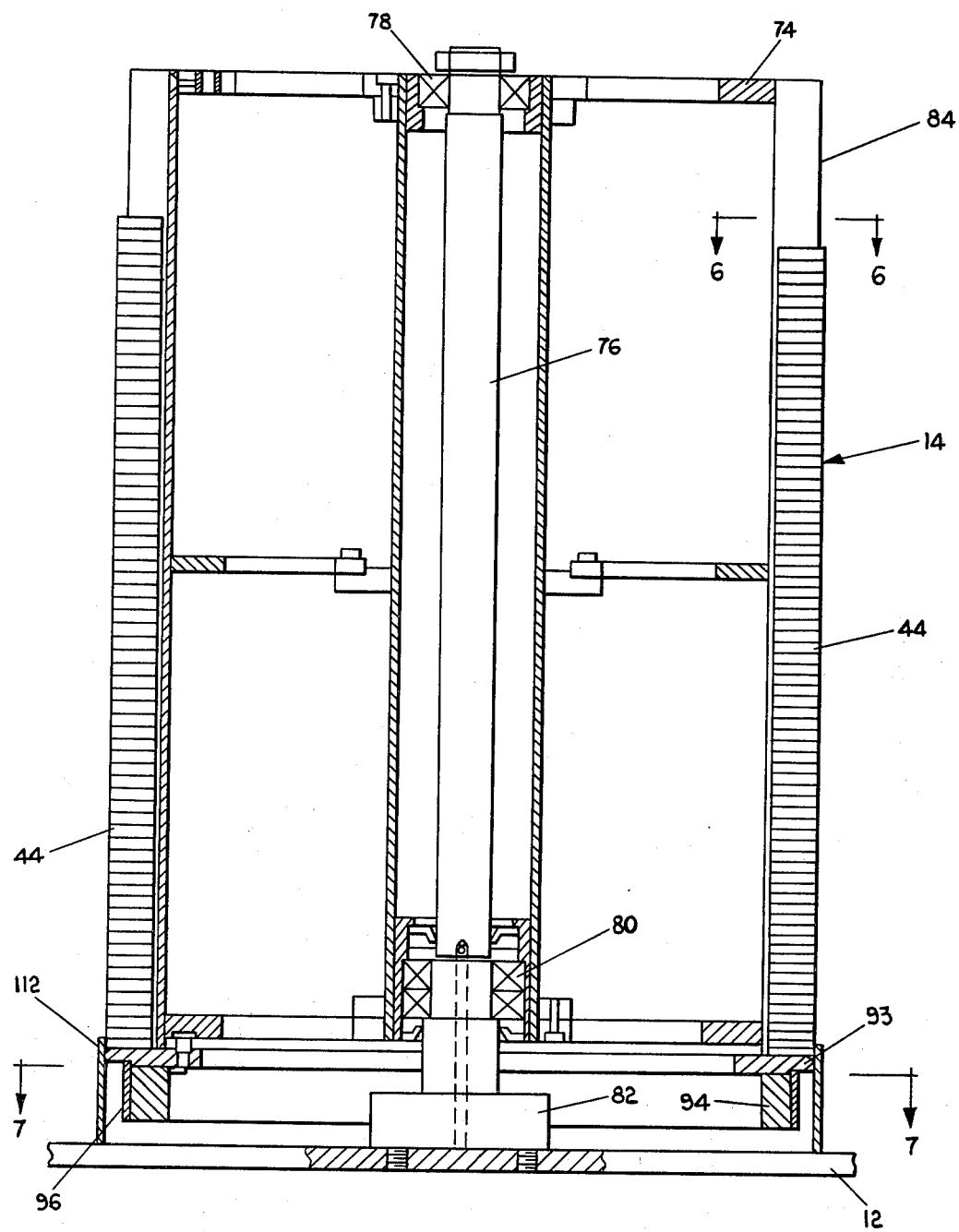
FIG. 5 is an enlarged elevational view in section of a sequencer used in the apparatus illustrated in FIGS. 1 through 3.
Figure 6:
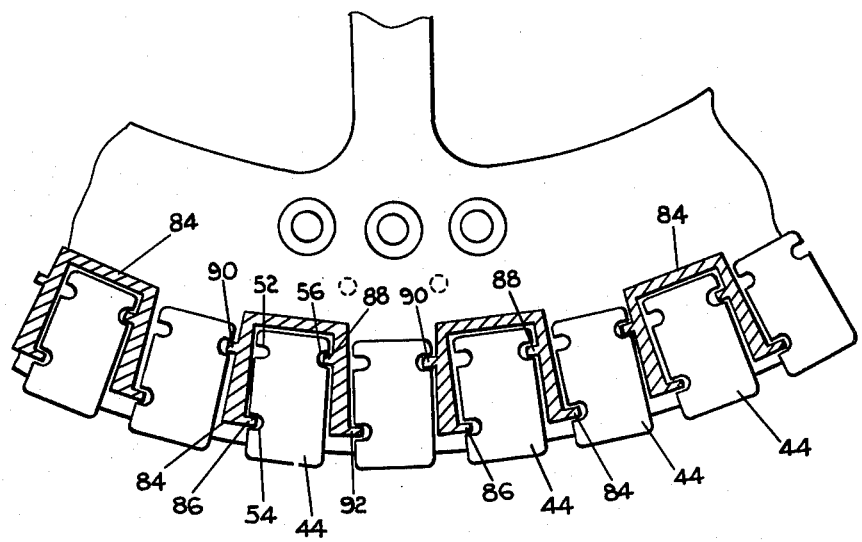
FIG. 6 is a further enlarged, partial plan view of the sequencer taken along lines 6—6 of FIG. 5.

Reference is now made to FIGS. 5 and 6 for a description of the sequencer in which the integrated circuit flat packs are loaded. The sequencer assembly 14 comprises a cylindrical housing 74 supported for rotation about a vertical axis on a support shaft 76 through bearings 78 and 80. The support shaft 76 is firmly secured to the frame 12 through a support plate 82 and bolts which extend through the support plate 82 and into the frame 12.

Flat pack glides 84 are spaced vertically about the cylindrical housing 74. Each of the glides 84 is U-shaped in cross-section and has inwardly directed positioning lugs 86 and 88 and outwardly directed positioning lugs 90 and 92. The glides 84 are spaced apart a distance approximately equal to the spacing between the legs of the glides. Thus, the outwardly directed lug 92 of one glide and an outwardly directed lug 90 of an adjacent glide 84 form a vertical channel into which flat packs can be loaded in upside down condition. As seen in FIG. 6, the flat pack assemblies are retained in the glides 84 by the lugs 86, 88, 90 and 92 which fit within the indentations 52, 54 and 56 of the flat pack carrier 46.

A ring 93 is mounted at the bottom of the housing 74 beneath the glides 84 to retain the flat pack assemblies 44 therein except at the decapper location.

Figure 7:
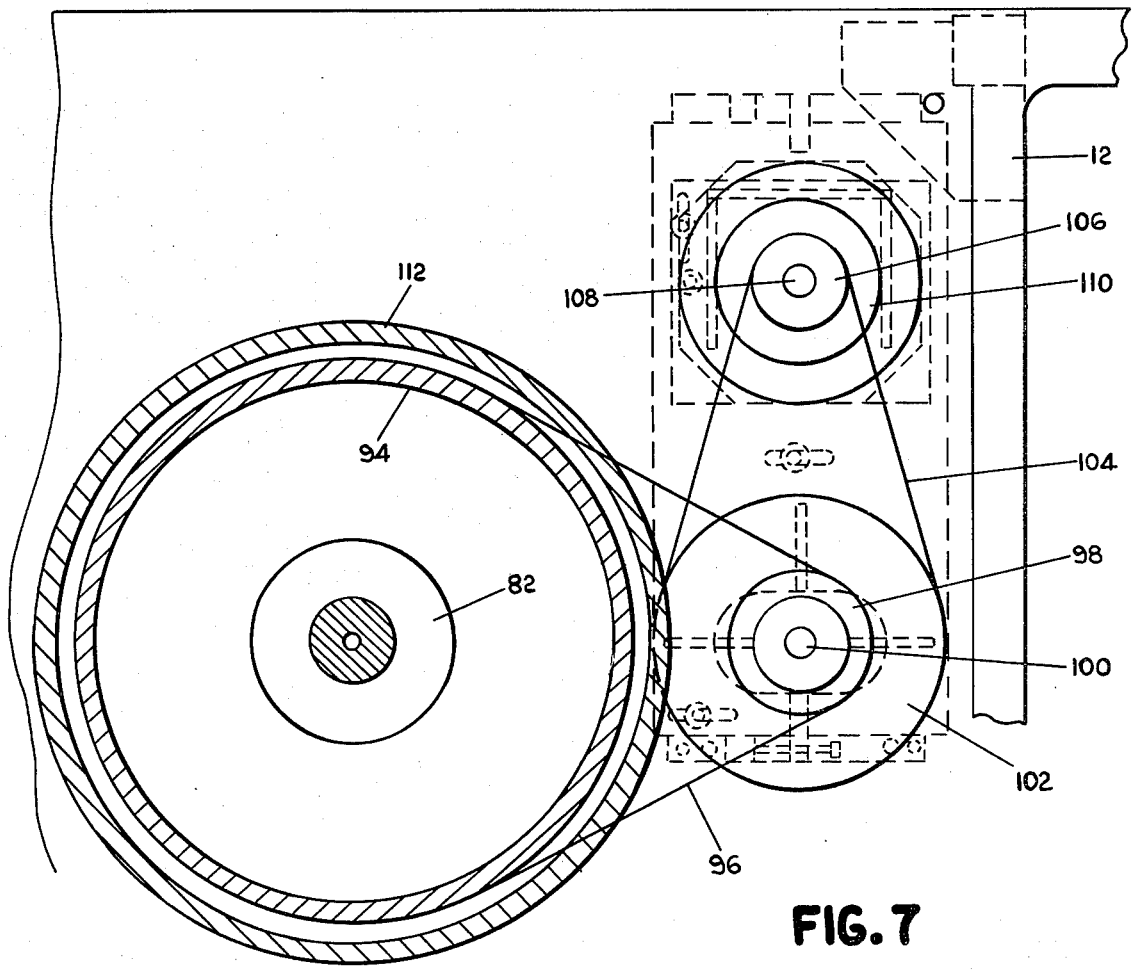
FIG. 7 is a plan view taken along lines 7—7 of FIG. 5.

As seen in FIGS. 5 and 7, a rim 94 is formed beneath the ring 93 and a pulley belt 96 is trained around the rim 94 and around a pulley wheel 98 mounted on an idler shaft 100 which, in turn, is mounted to the frame through a conventional bearing (not shown). A second pulley wheel 102 is secured to the idler shaft 100. A pulley belt 104 is trained around the pulley wheel 102 and around a pulley wheel 106 which is mounted on an output shaft 108 of an indexing synchronous motor 110. Thus, the motor 110 intermittently drives the sequencer 14 through pulley wheel 106, belt 104, pulley wheel 102, idler shaft 100, pulley wheel 98, belt 96 and rim 94. A shroud 112 mounted to the frame 12 surrounds the rim 94 and belt 96.

Figures 8, 9:
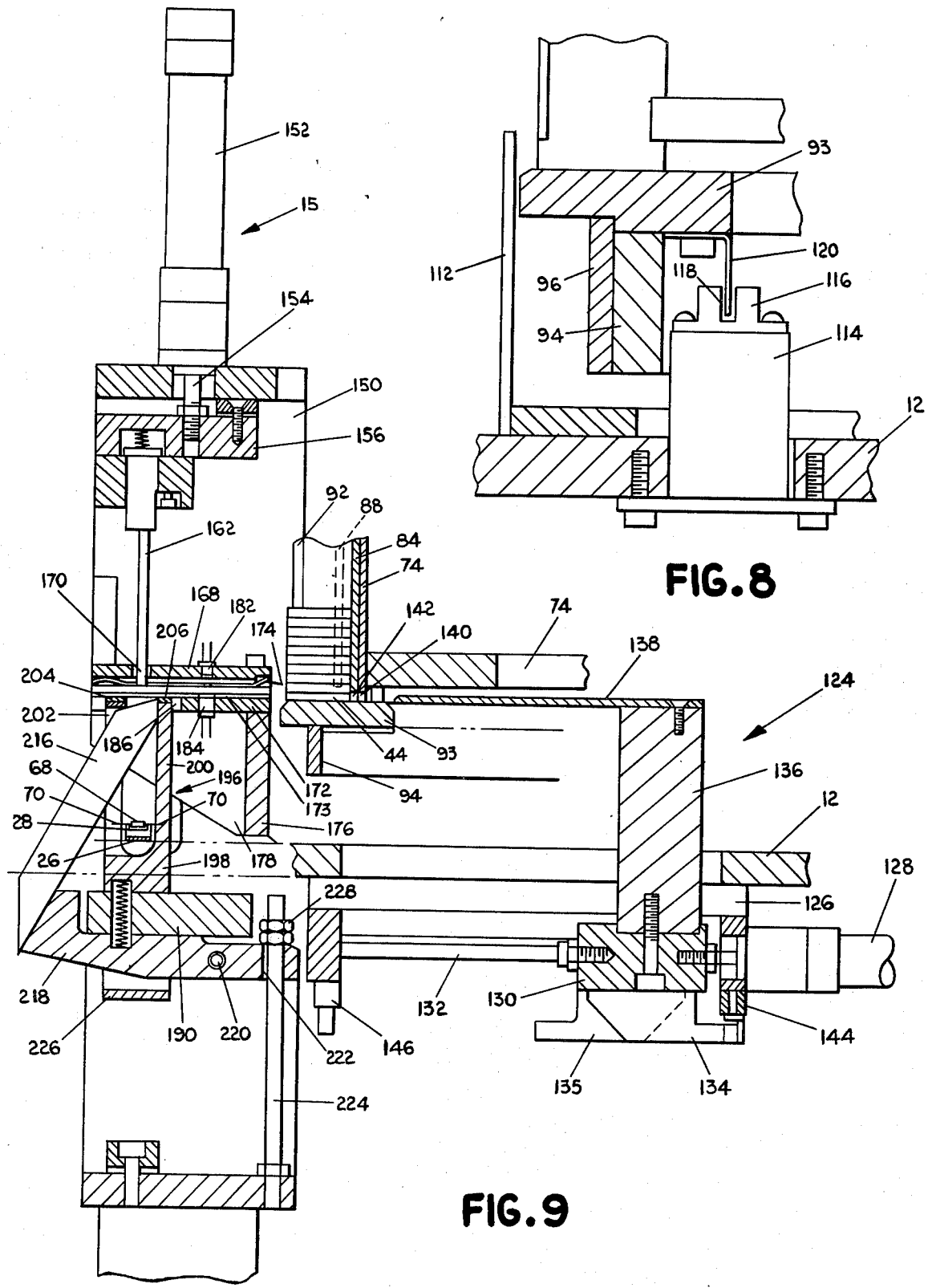
FIG. 8 is an enlarged partial view of a portion of the sequencer base in a view similar to FIG. 7.
FIG. 9 is an enlarged view of the bottom of the sequencer showing the pusher and decapper assemblies.

Reference is now made to FIG. 8 wherein there is shown an enlarged sectional view through the bottom of the sequencer 14. A bracket 114 is mounted in the top of the frame 12 and extends upwardly within the rim 94. A photon coupled interrupter module 116 having a vertical slot 118 is mounted on the bracket 114. A tab 120 is mounted to the bottom of the ring 93. The tab is sensed by the photon coupled interrupter module 116 as the sequencer turns and this information is in turn relayed to the control unit 38 to give a reference position of the sequencer with respect to the decapper. Thereafter the rotational position of the sequencer with respect to the decapper is kept by the control unit 38.

Approximately 50 different flat pack assembly channels are provided in the sequencer. The control unit is programmed with the type of flat pack IC in ech channel and moves the sequencer to provide the flat packs in desired order, regardless of the order of flat pack assemblies in the sequencer channels.

Reference is now made to FIG. 9 which is an enlarged sectional view of a portion of the bottom of the sequencer 14 and the decapper 15. As seen in FIG. 9, the positioning lugs 92 and 88 extend down to a point above the bottom of the ring 93. The space between the bottom of the lugs 92 and 88 is approximately equal to the thickness of an IC flat pack assembly 44. Positioning lugs 90 and 86 likewise extend down to a point identical with the termination of the lugs 92 and 88. Thus, a flat pack 44 can be easily dispensed from the bottom of the glides 84. A pusher assembly 124 is mounted beneath the top of the frame 12 and is secured thereto through a mounting bracket 126. An air cylinder 128 is secured to the mounting bracket 126 and has an extendible cylinder rod which is secured to a mounting bracket 130. The bracket 130 is supported for reciprocatory horizontal movement by two guide rods 132, only one of which is shown. A pair of fingers 134 and 135 extend downwardly from the bottom of the mounting bracket 130. A mounting bar 136 extends upwardly through a slot in the top of the frame 12 and mounts a pusher finger 138 which moves along the top surface of the ring 93. As illustrated in FIG. 9, the bottom of the cylindrical support 74 has a slot opening 140 and the back portion of the flat pack glide 84 has an opening 142 therein in registry with the pusher finger 138. Thus, as the cylinder 128 is actuated to move the mounting bracket 130 along the guide rods 132, the pusher finger 138 moves through the openings 140 and 142 and pushes an IC flat pack assembly 44 out from the bottom of the stack in the flat pack glide in registry with the pusher finger 138. A photon coupled interrupter module 144 is mounted beneath the air cylinder 128 for registry with the finger 134 when the mounting bracket 130 is in the retracted position. In like manner, a photon coupled interrupter module 146 is positioned at the front edge of the mounting bracket 126 for registry with the finger 135 when the mounting bracket 130 has been moved to its forward position. The positioning of the fingers 134 and 135 within the modules 144 and 146 results in a signal to the contol unit 38 to actuate the stopping of the movement of the air cylinder 128.

Decapper Assembly

Figure 10:
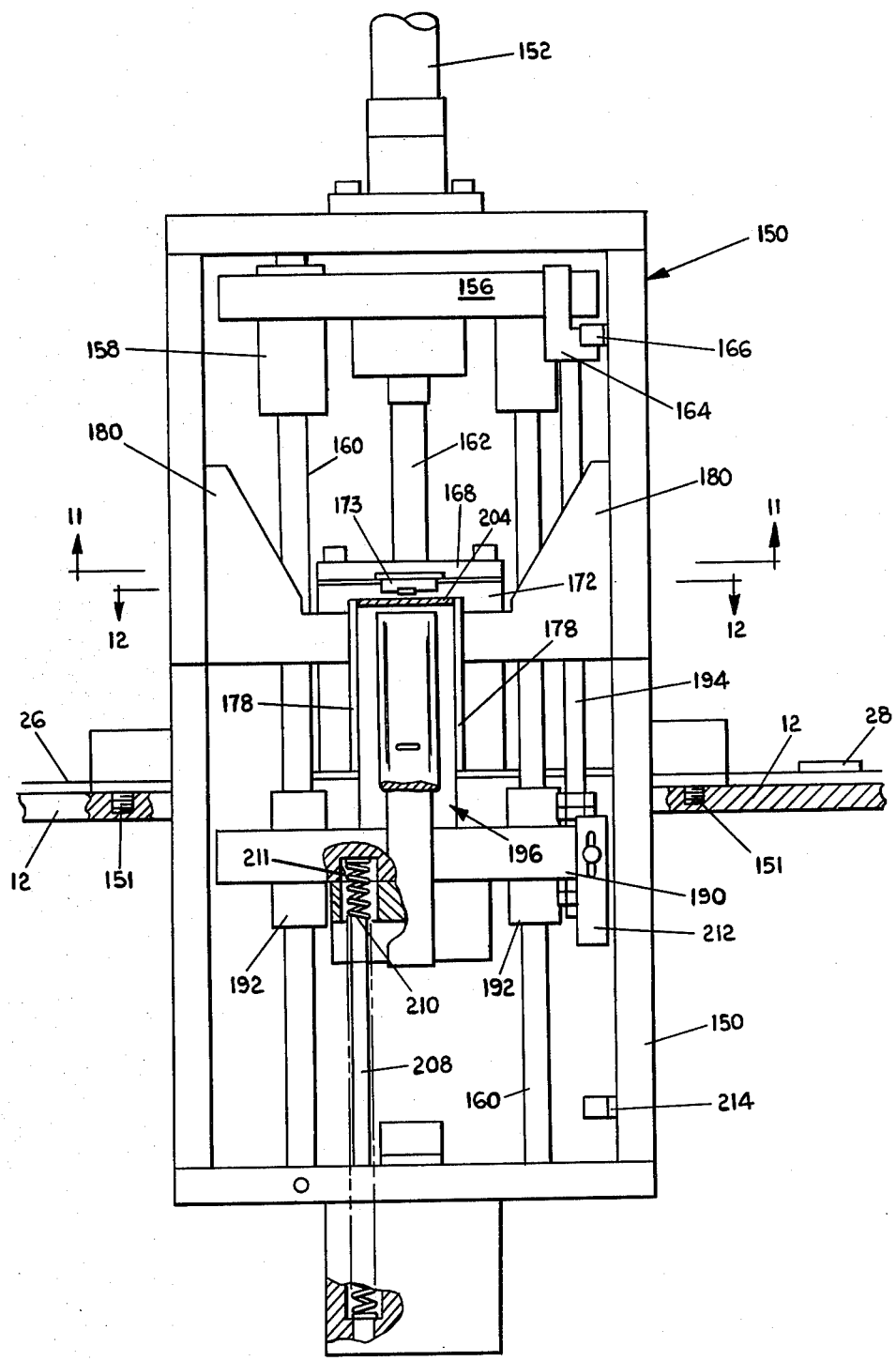
FIG. 10 is an enlarged front view of the decapper.
Figure 11:
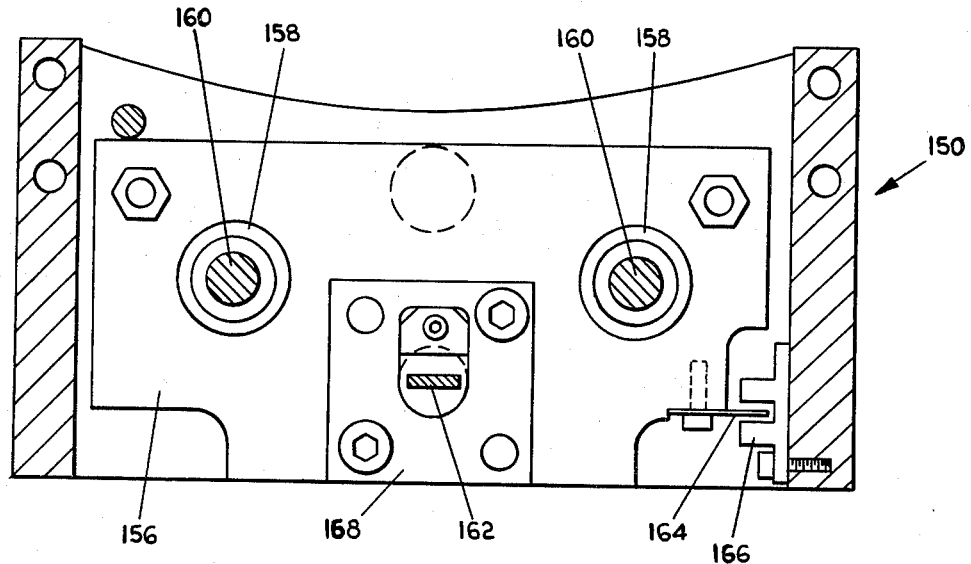
FIG. 11 is a sectional view taken along lines 11—11 of FIG. 10.

The decapper 15 will now be described with reference to FIGS. 9, 10, 11 and 12. The decapper 15 comprises a frame 150 which is secured to the top of the frame 12 through bolts 151. An air cylinder 152 is mounted on top of the frame 150 and has an extendible rod 154 which is secured to a platten 156. Ball bushings 158 are mounted on the platten 156 and surround guide shafts 160. A spring loaded punch 162 is mounted on and extends downwardly from the platten 156. As illustrated in FIG. 11, the punch at its lower portion is rectangular in configuration and shaped so as to fit within the window of the flat pack carrier to separate the retaining cap and release the integrated circuits from the carriers.

A tab 164 is mounted on the platten 156 and extends into a photon coupled interrupter module 166 which is mounted on the frame adjacent to the platten. The interrupter module 166 is electrically connected to the control unit 38 to indicate the time at which the platten 156 reaches its upper position.

Figure 12:
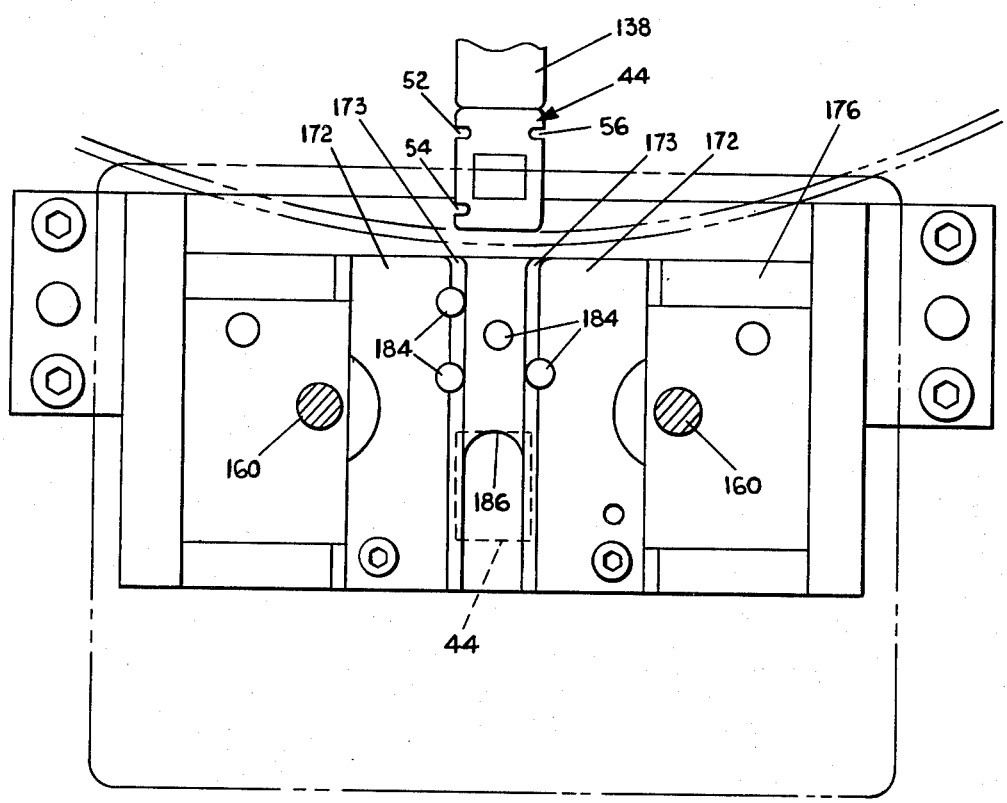
FIG. 12 is a sectional view taken along lines 12—12 of FIG. 10.

A plate 168 is mounted to the frame and has an opening 170 through which the punch 162 may pass. Guide blocks 172 having shoulders 173 are mounted to the frame 150 through a plate 176, brackets 178 and front plates 180 which are welded to the frame. The plate 168 is secured to the guide blocks 172 through bolts. A flat spring 174 is mounted to the plate 168 in a channel formed by the plate 168 and the guide blocks 172. The channel thus formed is sized to receive the narrower dimension of the flat pack as illustrated in FIG. 12.

A series of four IR emitters 182 are mounted in the plate 168 directly over four IR detectors 184 which are mounted in the guide blocks 172. The position of the IR detectors is illustrated in FIG. 12. Two of the IR detectors 184 are mounted one side of the channel in line with the indentations 52 and 54. A center detector is in line to detect the presence of integrated circuit 68 and a fourth detector 184 is positioned at the right side of the channel as viewed in FIG. 12 to detect the presence of the indentation 56. The signals from the detectors are applied to the computer control unit 38 which determines if the IC pack is properly oriented and detects whether an integrated circuit 68 is in fact present in the flat pack assembly 44. If the IC pack is not properly oriented, then the decapper is not operated and the machine stops. The improper orientation is displayed on the CRT display 40. The operator can then go to the decapper and properly orient the flat pack. If there is no IC in the carrier as detected by the central IR detector 184, then the decapper is again stopped and another IC flat pack of identical nature is called for by the control unit 38. When a new flat pack assembly is in proper place, the operation continues.

A slot 186 is provided in the front portion of the guide blocks 172 to allow the integrated circuit to pass therethrough after decapping. As illustrated in FIG. 12 the shoulders 173 of the guide blocks 172 extend the full length of the channel so that the flat pack carrier 46 is retained on the shoulders 173 when the integrated circuit is removed.

Referring once again to FIG. 10, a platten 190 is mounted at a lower part of the frame for reciprocatory movement on the guide shafts 160 through ball bushings 192. A support rod 194 rigidly connects the platten 190 with the platten 156. Thus, the air cylinder 152 moves the platten 156 and the platten 190 in unison.

A U-shaped support 196 extends upwardly from the platten 190 and is mounted thereto through a base portion 198. A solid back leg 200 extends up into the slot 186 and contains a magnetic support member 206 on the top surface thereof. The front of the U-shaped support 196 is formed by a bifurcated front leg 202 having a magnetic support bridge 204 extending thereacross. As illustrated in FIG. 9, the top surfaces of the magnetic support bridge 204 and the magnetic support member 206 are flush with the top surface of the guide blocks 172 and beneath the shoulders 173.

A rod 208 is slidably mounted at its upper end in the platten 190 and is secured at its bottom end to the frame 150. A compression spring 210 is axially positioned on the rod 208 and is seated in a socket 211 at the underside of the platten 190. Compression spring 210 assists the return of the platten 190 and platten 156 to the raised position which is illustrated in FIGS. 9 and 10. A tab 212 is adjustably mounted to one side of the platten 190 and in registry with a photon coupled interrupter module 214 which is positioned at the lower part of the frame 150, when the plattens 190 and 156 are in their lowermost position (not shown). The interrupter module is electrically coupled to the control unit 38 to indicate when the plattens 156 and 190 are in the lowermost position. The control unit 138, in turn, controls the operation of the air cylinder 152.

A chute 216 is mounted to the platten 190 through a support plate 218 and a dowel 220. The plate 218 has a vertical enlarged hole 222 at a back portion thereof. A guide rod 224 is secured to the bottom of the frame 150 and extends through the hole 222 in the plate 218. The guide rod 224 is threaded at its upper end and has a pair of bolts 228 threadably secured thereon. The lowermost of the bolts 228 bears against the top of the back portion of the plate 218 to position the plate 218 in the location indicated in FIG. 9. In this location, note that the chute 216 extends upwardly through the bifurcated front leg 202 of the U-shaped support 196 and in a position beneath the slot 186 in the guide blocks 172. Thus, the chute 216 is in a position to receive caps from the flat pack assemblies 44. A support plate 226 is secured to the platten 190 and extends beneath the bottom of the support plate 218 to support the plate 218 in the lowermost position.

In operation of the decapper, the flat packs are moved through the channel formed by the guide blocks 172 and onto the shoulders 173. As the flat packs move along the guide blocks, the positions of the indentations 52, 54 and 56 are detected by the side IR detectors 184. The presence of an IC is detected by the centrally located IR detector 184. The flat packs 44 are pushed into position by the pusher finger 138 in a manner described above. When the flat pack assembly 44 is positioned over the slot 186, air cylinder 152 is actuated to move the rod 154 downwardly, thereby moving the platten 156 and the punch 162 downwardly. The punch 162 contacts the integrated circuit 68 and pushes it from the flat pack, thereby releasing the cap 66 from engagement with the carrier 46. The cap then is caught by the chute 216 and falls into a container. As the integrated circuit 68 is released from the carrier 46, leads 70 come to rest on the magnetic support bridge 204 and the magnetic support 206. The spring 174 holds the flat pack carrier 46 firmly in place during movement through the guide blocks 172 and while the decapping operation is taking place. As the air cylinder rod 154 continues to move downwardly, the plattens 156 and 190 will move downwardly in unison, thereby drawing the U-shaped support 196 downwardly. As the platten 190 moves downwardly, the plate 218 will pivot on the dowel 220 until the bottom portion thereof rests on the support plate 226. As the plate 218 rotates, the chute 216 will likewise rotate counterclockwise as viewed in FIG. 9 so that it is free from interference with the conveyor belt 26. The air cylinder rod 154 continues to move downwardly until the tab 212 is in intercepting relationship with the photon coupled interrupter module 214. When the platten 190 reaches this lowermost position, the flat pack will be brought down so that the leads 70 thereof rest on the sides of the magnetic holder 28 as shown in phantom lines in FIG. 9. Thereafter, the conveyor belt is indexed through one increment, for example, six inches, and the integrated circuit on the magnetic holder 28 moves out from beneath the decapper. The air cylinder is thereafter actuated to retract the rod 154, thereby raising the plattens 156 and 190. When the next integrated circuit flat pack assembly is moved into position, the empty carrier is pushed by the new flat pack assembly 44 out of the slot and is collected in a bin (not shown) adjacent to the decapper.

Centering Assembly

Figure 13:
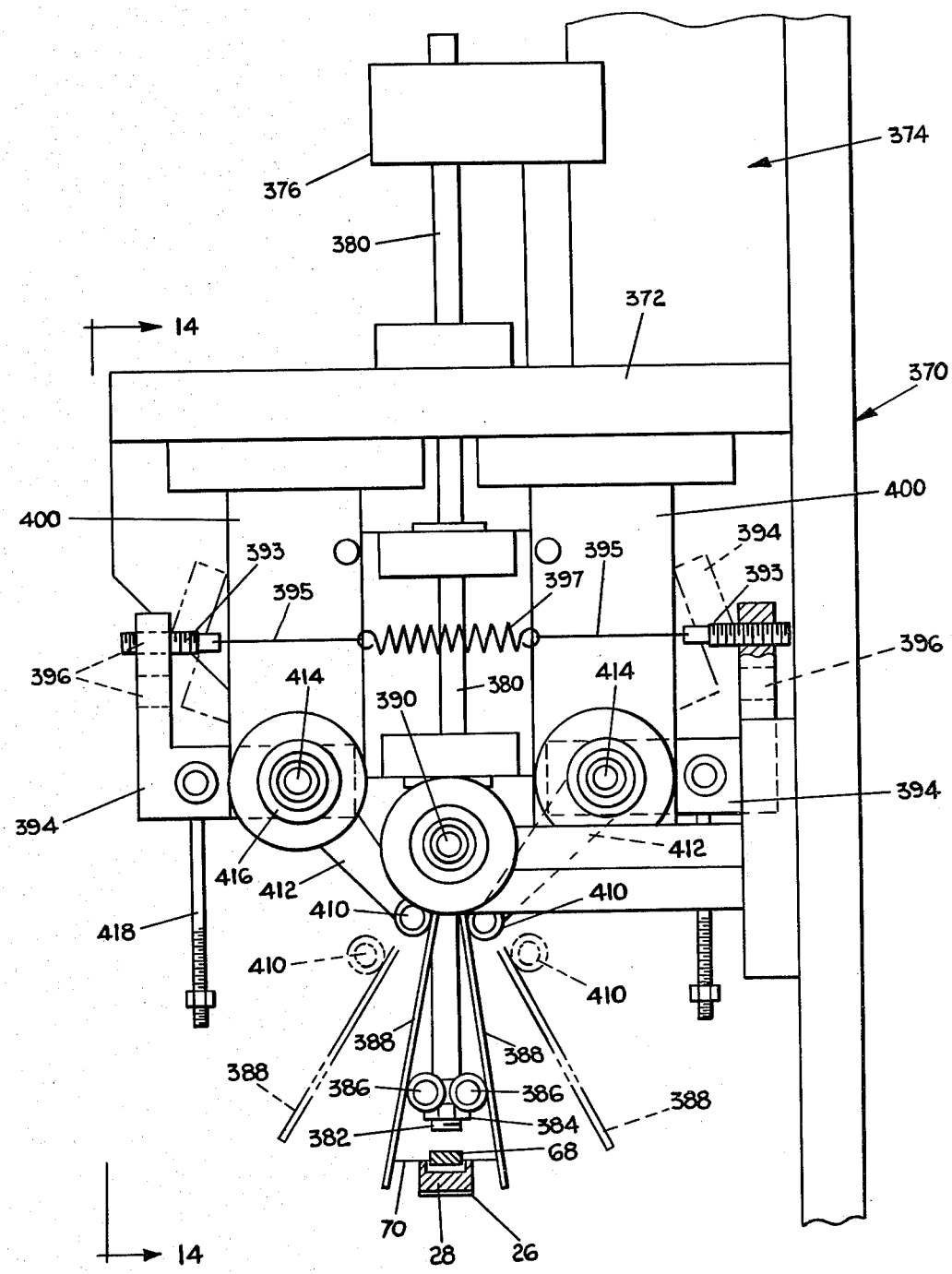
FIG. 13 is a sectional view taken along lines 13—13 of FIG. 1, showing the centering device.
Figure 14:
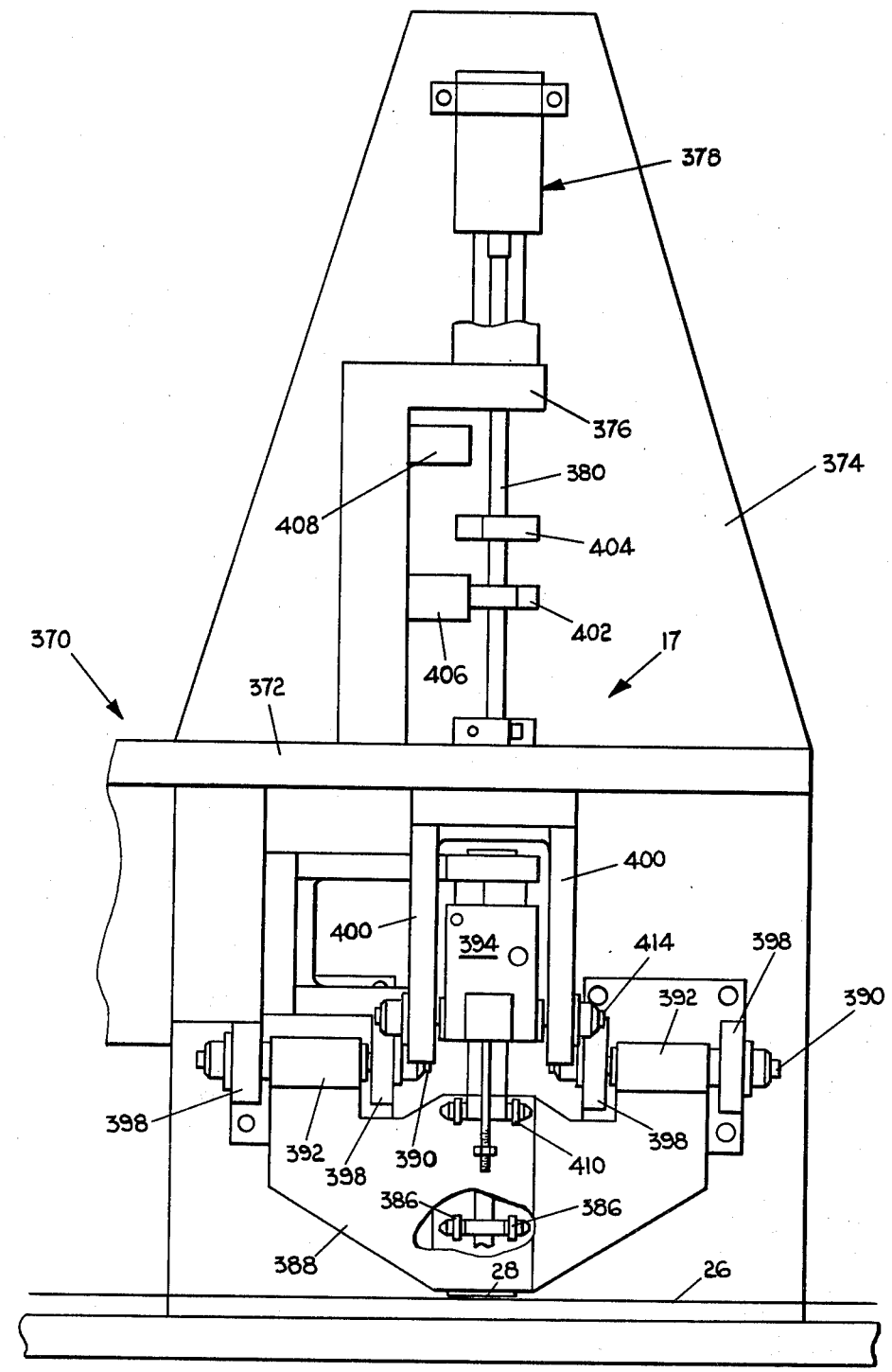
FIG. 14 is an enlarged side elevational view of the centering assembly.

Reference is now made to FIGS. 13 and 14 for a description of the centering assembly 17. A centering frame 370 is mounted on the frame 12 and includes a top plate 372, an upright support 374 and an L shaped guide member 376. An air cylinder 378 is mounted on upright support 374 and has an actuator rod 380 secured thereto for reciprocal vertical movement. The actuator rod 380 extends through bushings in guide 376 and has a threaded end 382 on which bolt 384 is threaded. A series of cam rollers 386 are mounted on the end of the actuator rod 380 and are retained thereon by bolt 384.

A pair of centering plates 388 are mounted on mounting shafts 390 through bearing structures 392 in contact with cam rollers 386. The mounting shafts 390 are journaled in hanger brackets 398 which in turn are secured to the centering frame 370. Counterweight plates 394 are mounted on and extend outwardly from the bearings 416. Arms 412 are mounted on bearings 416 and extend downwardly therefrom. Rollers 410 are mounted on the end of arms 412 in contact with the outer surface of plates 388. A threaded adjusting pin 393 is threaded into a hole 396 in each of the plates 394. A cable 395 is secured to each adjusting pin 393 and an extension spring 397 joins the cables. The spring 397 provides pressure relief for the force of rollers 410 on plates 388 to accomodate different length leads. Other holes 396 are provided in the plates 394 for adding bolts or other similar weighting devices to provide an appropriate counter-balance for the arms 412. Shafts 414 are journaled in support plates 400 which are suspended from the top plate 372. In like manner, rods 418 are rotatably mounted on plates 394 for adding weight thereto.

Actuator tabs 402 and 404 are mounted in spaced relationship to an upper part of the actuator rod 380. Photon coupled interrupter modules 406 and 408 are mounted to the guide 376 in spaced relationship and in positions of registry with the actuator tabs 402 and 404 respectively. When the rod is in its lowermost position as illustrated in FIGS. 13 and 14, the actuator tab 402 will be in interrupting relationship with the photon coupled interrupter module 406. When the actuator rod 380 is in its uppermost position, the actuator tab 404 will be in interrupting relationship within the photon coupled interrupter module 408. The interrupter modules 406 and 408 are coupled directly to the computer to indicate to the computer the position of the actuator rod 380. The computer controls the flow of air to the cylinder 378 through a valve means (not shown). Responsive to a signal from the interrupter module 406, the flow of air to the cylinder 378 will be cut off. Upon completion of the centering operation, the flow of air to the air cylinder will be reversed in order to raise the actuator rod 380 until such time as the actuator tab 404 interrupts the signal in the interrupter module 408. Responsive to an interrupted signal from the interrupter module 408, the computer will cut off the flow of air to the cylinder 378.

In operation of the centering assembly 17, the conveyor belt 26 will move a magnetic holder 28 having positioned thereon an integrated circuit 68 into position beneath the actuator rod 380. During this period of time, the actuator rod is in retracted position and the rollers are in the raised position in which the centering plates 388 will be forced outwardly to the position illustrated by phantom lines in FIG. 13. Upon positioning of the integrated circuit 68 beneath the rod 380, the air cylinder 378 is actuated to move rod 380, the air cylinder 378 is actuated to move rod 380 downwardly to the position illustrated in full line in FIGS. 13 and 14. During the downward movement of the rod 380, the centering plates 388 will rotate toward the integrated circuit 68. Light pressure is applied to the centering plates 388 by the rollers 410. If the integrated circuit is not centered on the magnetic holder 28, one of the plates 388 will contact one set of leads and force the integrated circuit 68 toward a central position on the holder 28 until such time as the leads on the other side of the integrated circuit 68 come in contact with the other plate 388. Because the rollers 410 are counterbalanced, they apply extremely light force to the leads 70.

Die Trim and Lead Forming Assembly

Figure 15:
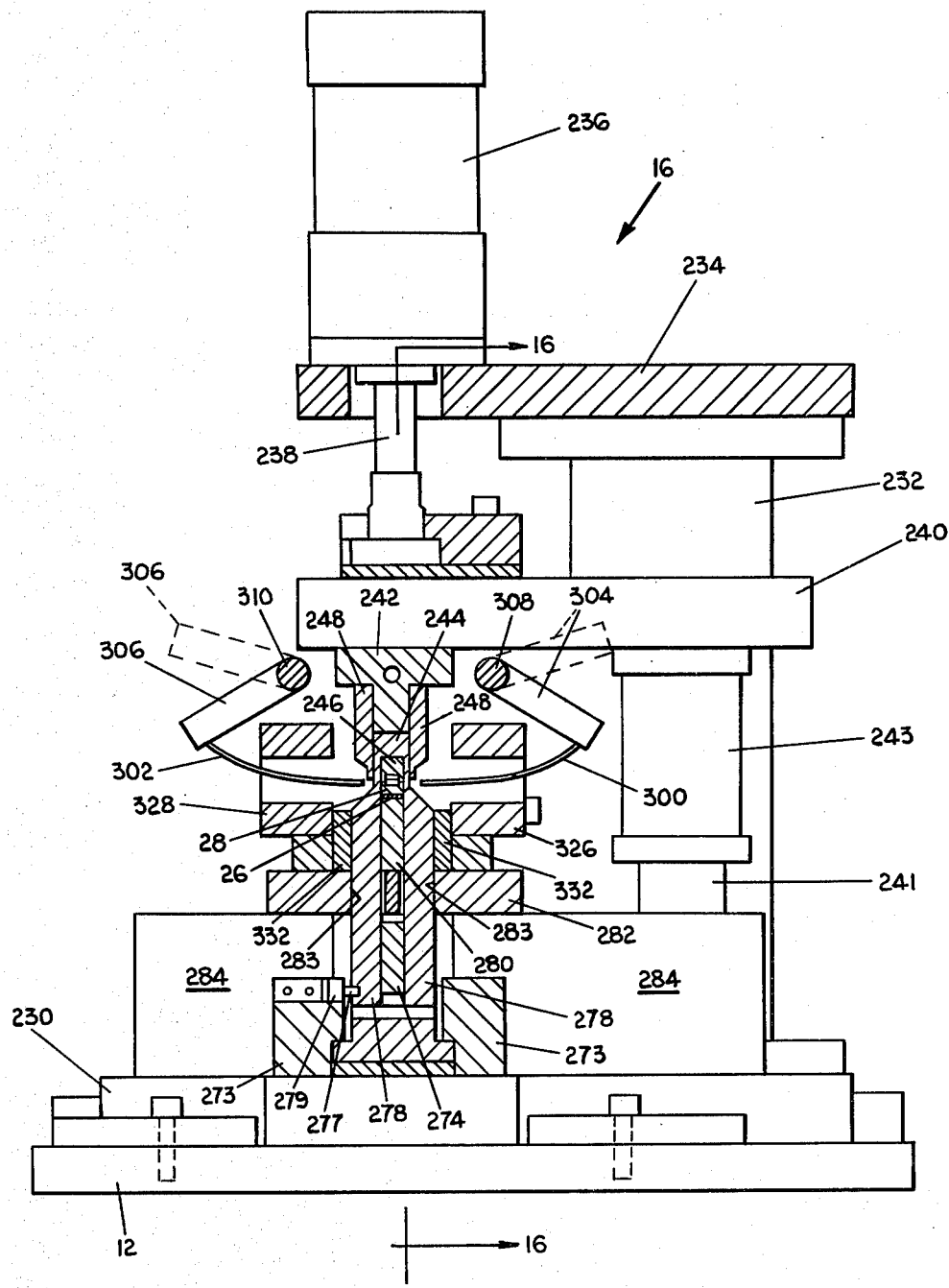
FIG. 15 is a sectional view taken along lines 15—15 of FIG. 1, showing the die-trim and lead-forming assemblies.
Figure 16:
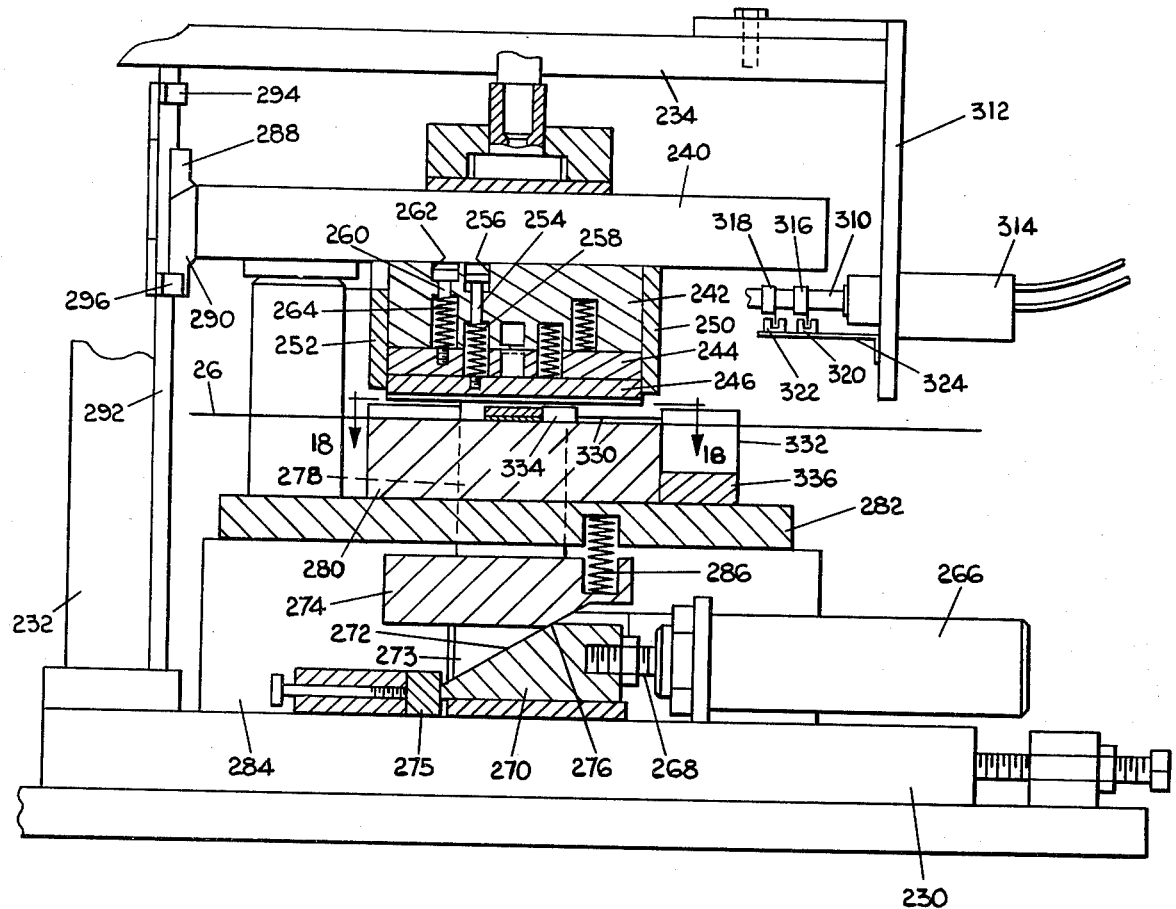
FIG. 16 is a sectional view taken along lines 16—16 of FIG. 15.

Reference is now made to FIGS. 15 and 16 for a description of the die-trim and lead-forming assembly 16. A base 230 is secured to the frame 12 through bolts as illustrated in FIG. 15. Upright supports 232 are secured to the base 230 and cylinder plate 234 is secured to the top of the upright support. An air cylinder 236 is mounted on top of the cylinder plate 234 and has a rod 238 which extends downwardly therefrom. The rod 238 is secured to a platten 240 at the lower end thereof. The platten 240 is slidably mounted for vertical reciprocal movement on two guides 241 (only one of which is shown) through elongated ball bushings 243. A support block 242 is secured to the platten 240 and mounts an upper lead-forming die member 244, a hold-down pad 246 and a lead trim die 248. As seen in FIG. 16, guide plates 250 and 252 are positioned at either end of the upper lead-forming die 244 and hold-down pad 246 to slidably retain the die 244 and the hold-down pad 246 therebetween. The hold-down pad 246 is secured to the support block 242 through bolts 254, the heads of which are positioned in countersunk holes 256 in the support block 242. The bolts 254 extend through the central portion of the upper lead-forming die member 244. A compression spring 258 is mounted between the support block 242 and the hold-down pad 246 about the bolts 254 to bias the hold-down pad 246 downwardly with respect to the support block 242. Note that the extent of downward travel of the hold-down pad 246 is limited by the distance which the head of the bolts 254 can travel in the countersunk holes 256.

In like manner, the upper lead-forming die 244 is secured to the support block 242. To this end, bolts 260 stand between the support block 242 and threadably engage the upper lead-forming die 244. The heads of the bolts 260 are positioned in countersunk holes 262 to permit a limited degree of travel of the die 244 with respect to the support block 242. Compression springs 264 are mounted about the bolts 260 to bias the upper leadforming die 244 downwardly with respect to the support block 242.

An air cylinder 266 is mounted to the base 230 and has a rod 268 which extends outwardly therefrom. The rod is secured at its outer end to a shim block 270 having a 30° inclined surface 272. The shim block is guided in guide blocks 273. An adjustable shim stop 275 is mounted on the base 230 to limit the outward or forward movement of the shim block 270. A spacer block 274 has a 30° inclined surface 276 which is complementary to the inclined surface 272 of the shim block 270. The spacer block 274 is secured to lead-forming die members 278 which extend upwardly adjacent to the conveyor belt 26 and the magnetic holder 28.

An interrupter pin 277 is mounted to a bottom position of the lower lead-forming die 278 and a photon coupled interrupter module 279 is mounted on a guide block 273 in registry with the pin 277 as the lower leadforming die 278 is raised.

As conveyor motion stops, a signal from the computer actuates air cylinder 266, driving rod 268 outward, which in turn drives the shim block 270 to the adjustable shim stop 275. Forward motion of shim block 270 drives surface 272 against mating 30° surface 276 of lower lead-forming die 278, thereby raising the top die members 278 flush with the bottom of flat pack leads 68 as they rest on magnetic carrier 28. As this vertical displacement takes place, the pin 277 breaks a circuit in photon coupled interrupter module 279. The signal generated thereby denotes that the lower lead-forming die is fully extended before driving air cylinder 236, which event happens almost simultaneously.

A belt support 280 is mounted directly beneath the belt 26 to provide a firm support therefor. The support 280 is mounted to a horizontal slotted plate 282 having slots 283 through which the lower lead-forming die members 278 may pass. The slotted plate 282 is supported by upright plates 284 which in turn are secured to the base 230. Springs 286 (only one of which is shown in FIG. 14) are positioned in sockets in the slotted plate 282 and in the spacer block 274 to bias the spacer block 274 against the shim block 270.

Figure 17A:
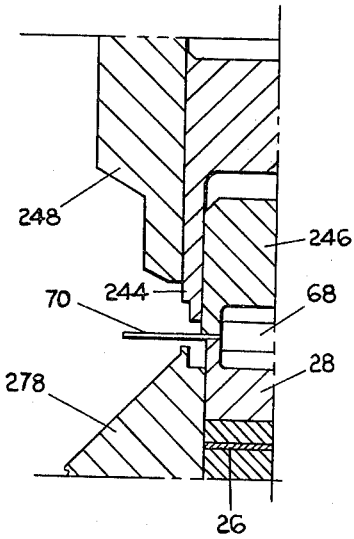
FIGS. 17A, B and C are partial views of the die-trim and lead-forming assemblies showing the manner in which the leads are formed and trimmed.
Figure 17B:
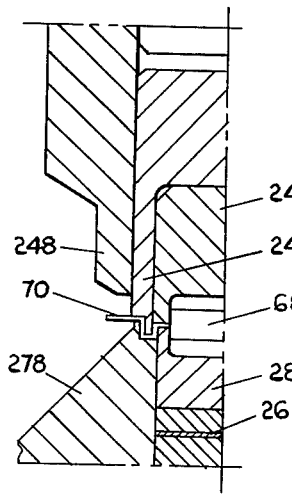
Figure 17C:
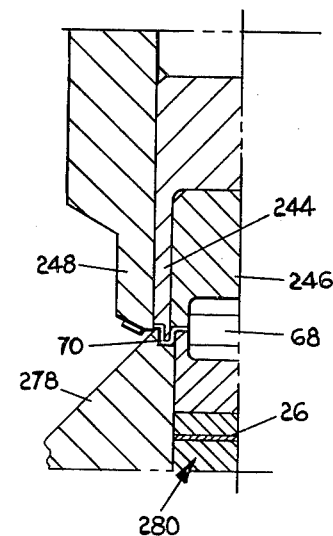

The operation of the lead-forming and trim dies will be illustrated with reference principally to FIGS. 17A, 17B and 17C. As the integrated circuit on the holder is moved into place on the belt support 280, the lower lead-forming dies will be positioned a slight distance, for example 40/1000 of an inch beneath the leads 70 of the integrated circuit. This permits a clearance so that the leads can move into position without obstruction from the lower lead-forming die. Cylinder 266 is then actuated to extend rod 268, thereby raising the lower lead-forming dies to a point of contact with the leads 70. This position is detected with a photocell in a manner which will be described hereinafter. Subsequent thereto, the air cylinder 236 is actuated to extend the rod 238 downwardly. As the cylinder rod 238 moves downwardly, the hold-down pad 246 will come in contact with the leads 70, thereby clamping the leads between the upper edges of the magnetic holder 28 to the lower portion of the hold-down pad 246. As the rod 238 continues to move downwardly, upper lead-forming die 244 will move downwardly with respect to the pad 246 until it reaches the position illustrated in FIG. 17B wherein formation of the leads takes place in the manner illustrated in FIG. 17B. As the cylinder rod 238 continues to move downwardly, the trim die 248 will move downwardly with respect to both the hold-down pad 246 and the upper lead-forming die 244 to sever the lead at the outer edge of the lower lead-forming die 278 and the upper lead-forming die 244.

Thereafter, the cylinder 236 is actuated to move the rod 238 upwardly whereby the reverse process takes place. Subsequent thereto, the cylinder 266 is actuated to retract the rod 268, thereby lowering the lower lead-forming die 278 to the position illustrated in FIG. 17A.

From the foregoing, it will be appreciated that each lead has four bends. Each of these bends, excluding the foot forming bend at the end of the leads, can be considered a vibration stress relief point for the IC in the printed circuit board assembly. The presence of solder at these bends mitigates the stress relief value of the bends. The three additional bends in the leads provide a multitude of stress relief points at least the innermost of which will be most likely to be free of solder. Thus, the lead design enhances IC stress relief properties and provides for "X" axis positioning of the IC on the holder 28.

Still referring to FIGS. 15 and 16, a pair of fingers 290 and 288 are mounted to one side of the platten 240. An upright member 292 is mounted between the base 230 and the cylinder plate 234. Photon coupled interrupter modules 294 and 296 are mounted in spaced relationship on the support member 292 for registry with the fingers 288 and 290. Thus, when the cylinder rod 238 is extended and the lead trim die 248 is in its lowermost position, the finger 290 will be positioned in the location shown in FIG. 16, that is in registry with the photon coupled interrupter module 296. The interrupter module 296 is electrically connected to the computer control unit 38 which controls the air cylinder 236 to indicate the down position of the cylinder rod 238. Thus, as the finger 290 interrupts the light in the interrupter module 296, the computer will cease the downward movement of the cylinder rod 238 and actuate retraction of the same. When the rod reaches its uppermost position, the finger 288 will be in registry with the photon coupled interrupter module 294 which is also connected to the computer control unit 38 to indicate the upper position of the cylinder rod 238. Upon interruption of the light signal in the interrupter module 294 by the finger 288, the computer will cease the upward movement of the cylinder rod 238.

Means are provided for removing the scrap from the lead-forming and trim-die area. Such means comprise electromagnetic scrap-removal elements 300 and 302 which are in the form of a metal band formed in an arc. The scrap-removal elements 300 and 302 are respectively mounted on pivot arms 304 and 306 which are fixed to rotatable shafts 308 and 310. The shafts 308 and 310 are journaled in support plate 312 which is mounted on cylinder plate 234. A rotary air cylinder 314 is secured to the support plate 312 and has a rotatable output shaft which is secured to the shaft 310 for rotation thereof. A rotary air cylinder (not shown) is likewise secured to the shaft 308 in an identical manner. Each of the shafts 308, 310 has interrupter tabs 316 and 318 positioned thereon for registry with slots in photon coupler interrupter modules 320 and 322 which are mounted on support plate 312 through bracket 324. Thus, as the shafts 310 and 308 rotate, the tabs 316 and 318 will come in registry with the slots in the photon interrupter modules 320 and 322. The tabs 316 and 318 are spaced 90° apart from each other so that the photon coupled interrupter modules 320 and 322 will be interrupted at 90° intervals. The modules 320 and 322 are connected by electrical means (not shown) to the computer to indicate the rotational position of the scrap removal elements 300, 302. Annular coils 326, 328 are positioned at the trim die 248 and bottom lead forming die 278 in registry with the elements 300 and 302 to magnetize the same.

In operation of the scrap remover, the air cylinder is actuated to move the scrap removers 300 and 302 through the central portions of the coils 326, 328 and into proximity of the leads 70 on the integrated circuits 68 as illustrated in FIG. 15 prior to trimming of the leads. Alternating current is applied to the coils 326, 328 to magnetize the scrap-removal elements 300 and 302 to attract the leads. After the leads are severed in the manner described above, the severed portions of the leads will be magnetically attracted to the scrap-removal elements 300 and 302 and will be magnetically held thereto. Air cylinder 314 will then be actuated to rotate shafts 308 and 310, thereby rotating the scrap-removal elements 300 and 302. As elements 300 and 302 are rotated out of coils 326 and 328, the A/C magnetic field is reduced in intensity as the distance from the coils 326 and 328 increases. This movement in effect created a diminishing magnetic field and, in conjunction with A/C current, is now a demagnetizer for the elements 300 and 302. Thus, the scrap leads begin to drop into spent lead receptacles (not shown) as the elements 300 and 302 move to the position shown in phantom lines in FIG. 15. When the removal elements 300 and 302 are in the position illustrated by phantom lines in FIG. 15, the tab 318 will be in registry with the photon interrupter 322. Responsive to the interrupted signal from the interrupter modules 322, the computer control unit 38 will cause the electrical current in the coils 326, 328 to be abated. Thereafter, upon positioning of a new integrated circuit flat pack in the lead-forming and trim die, the computer control unit 38 will actuate the air cylinder 314 to return the scrap-removal elements 300 and 302 to the position illustrated in FIG. 13.

Figure 18:
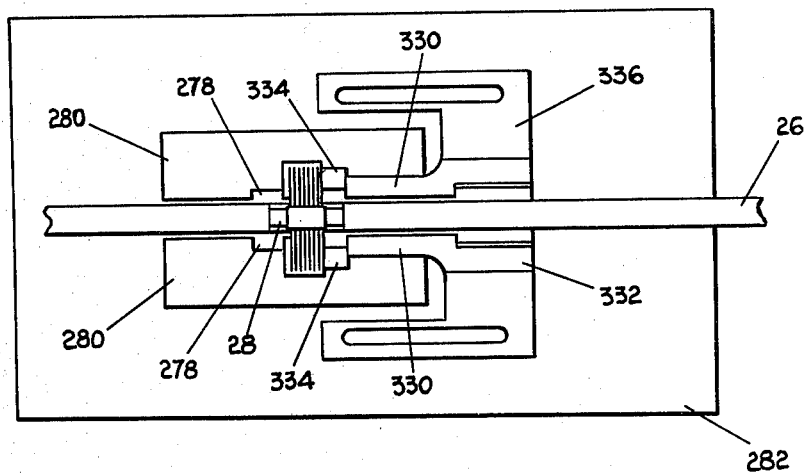
FIG. 18 is a sectional view taken along lines 18—18 of FIG. 16, showing the flat pack positioning mechanism.

Reference is now made to FIG. 18 for a description of the means for positioning the flat packs in a predetermined "Y" location on the magnetic holders 28. Springs 330 are secured to upright support members 332 on either side of the conveyor belt 26. Stop blocks 334 are mounted to the ends of the springs 330 and have outwardly and upwardly slanted top surfaces. The upright supports, in turn, are mounted to the top of the slotted plate 282 through a U-shaped based block 336. The springs extend to a position where the outer top portion of the stop blocks 334 contact the very ends of the IC leads 70 as the leads move into place beneath the lead-forming and trim-die members. The holders 28 are deliberately overdriven a small distance so that the IC 68 is moved backwardly on the holders 28. In this manner, the IC's 68 are positioned in a predetermined "Y" location on the holders 28. It will be appreciated from the foregoing that this "Y" location on the holder 28 will be maintained throughout the remainder of the cycle. Because the holder 28 forms a part of the lead forming die, the "Y" location is not disturbed by the trim and forming operation.

When the lower lead-forming dies 278 move upwardly, the springs 330 are moved out of interference with the leads. After the ends of the leads are severed in the manner described above, the stop blocks 334 will then be outside of any interfering position with the remaining portions of the leads on the integrated circuit 68.

Flux Assembly

Figure 20:
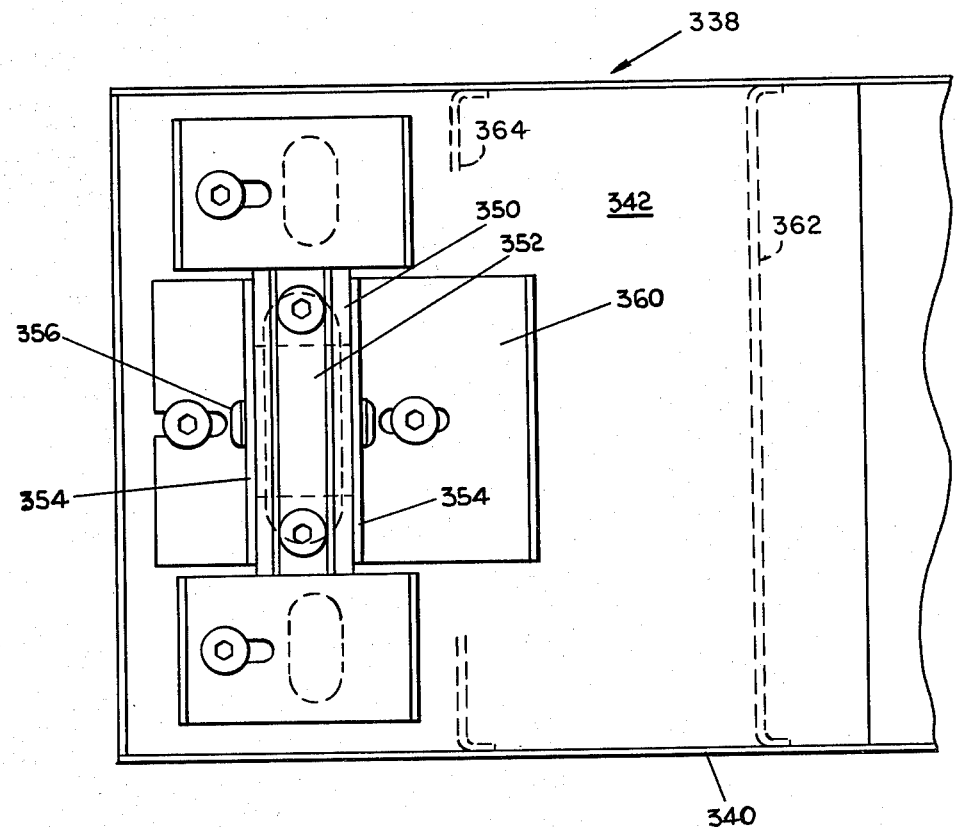
FIG. 20 is a plan view of the flux assembly seen along lines 20—20 of FIG. 19.
Figure 19:
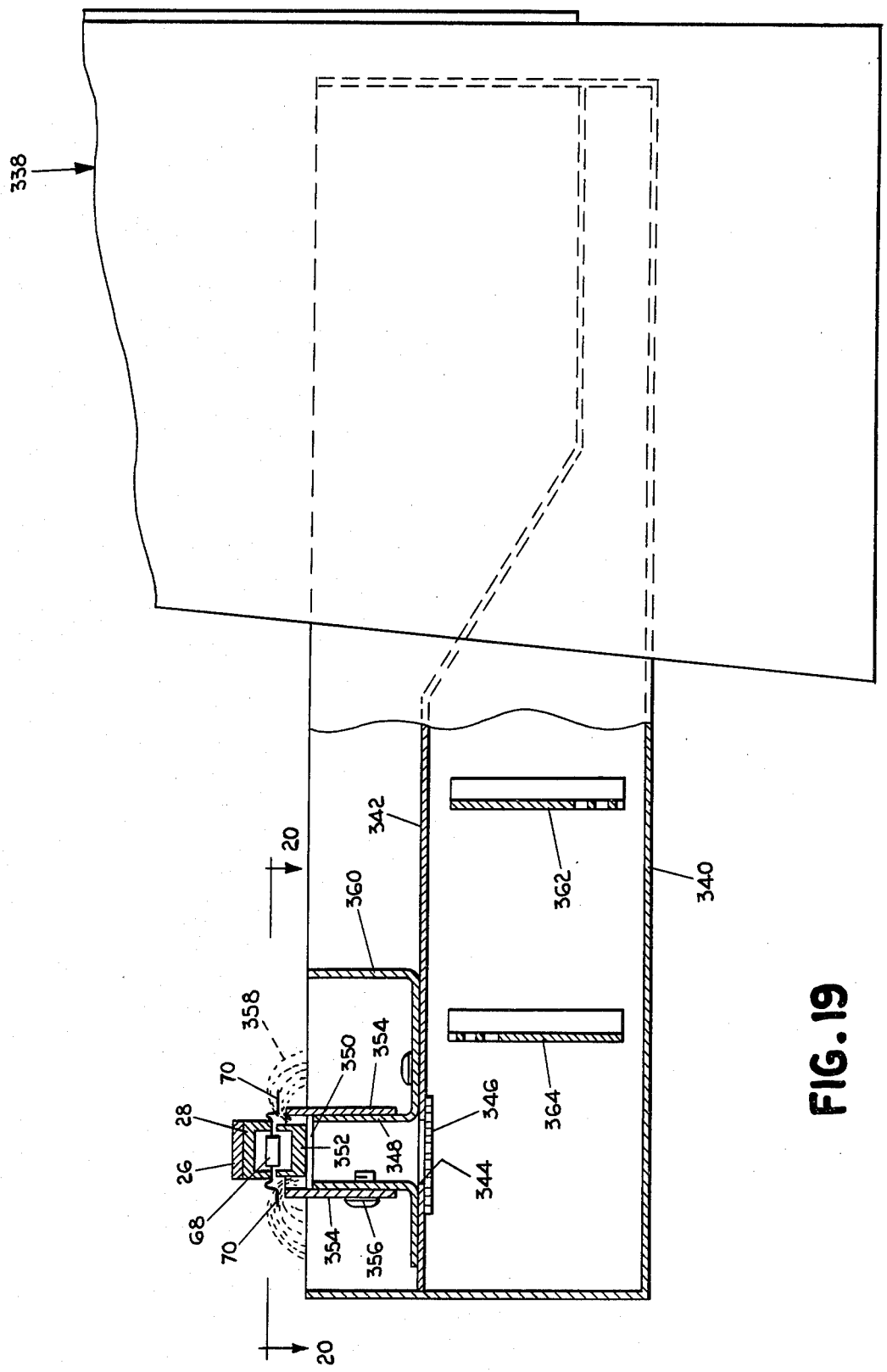
FIG. 19 is a sectional view through lines 19—19 of FIG. 1 showing the flux assembly apparatus.

Reference is now made to FIGS. 19 and 20 for a description of the flux assembly 18. A flux Wave Dipper 338 is secured to the frame through means not shown and provides flux material under pressure to the bottom portion of flux pan 340. The flux Wave Dipper is an apparatus which is conventionally available from Electrovert, Inc., of Mount Vernon, N.Y. An example of a suitable flux Wave Dipper is a Model FWDN sold by Electrovert, Inc. The flux pan has a horizontal divider panel 342 dividing the lower portion from the top portion thereof and also includes a pair of spaced vertical baffle plates 362 and 364. An opening 344 is provided at one end of the divider panel 342 and a perforated plate 346 is mounted to the divider panel 342 over the opening 344. The perforated plate 346 provides the necessary openings to maintain a controlled flow therethrough. Channel members 348 form a flux-containing box on the divider panel 342 over the opening 344. End supports 350 on the top of the channel members 348 support a flow divider 352 which is mounted thereto through suitable bolts. Adjustable weir plates 354 are adjustably secured to the channel members 348 through machine screws 356. The weir plates contain slots to permit upward and downward adjustment of the weir plates with respect to the channel members 348. Plate 360 is provided in spaced location from the channel members 348 to direct the flow down along the divider panel 342 and back to the Wave Dipper assembly 338. The Wave Dipper assembly 338 contains a pump and a supply of flux. The pump supplies the flux to the bottom portion of the flux pan 340 and forces the flux through the perforated plate 346 under pressure. The flux flows upwardly in the enclosure formed by the channel members 348 and is directed over the sides of the weir plates 354 by the divider 352. As illustrated in FIG. 19, the conveyor belt 26 with the magnetic holders 28 bring the integrated circuits 68 in inverted position directly over the flow divider 352. The leads 70 pass directly through the flow pattern 358 of the flux which is indicated in phantom lines in FIG. 19. In this manner, flux is applied to leads 70 as the integrated circuit passes over the flow divider 352.

Solder Assemblies

The solder assemblies 20 are substantially identical to the flux assembly except that the Wave Dipper supplies solder in lieu of the flux Wave Dipper 338. The solder Wave Dipper, for example, can be an Electrovert, Inc. wave dipper Model WD-C or WD-CHT which supplies flux to a fountain pattern in the same fashion as illustrated in FIG. 19. The leads are carried through the flux wave pattern in substantially the same fashion as illustrated in FIG. 20. Preferably, the flow of the solder is directly slightly countercurrent to the direction of movement of the conveyor belt so as to avoid bridging of the solder between the leads. As indicated above, the first solder assembly 20 is maintained at a higher temperature than the second so that migration of the solder onto the leads 20 is maximized in the first solder assembly and solder buildup on the leads is maximized in the second solder assembly.

Figure 20A:
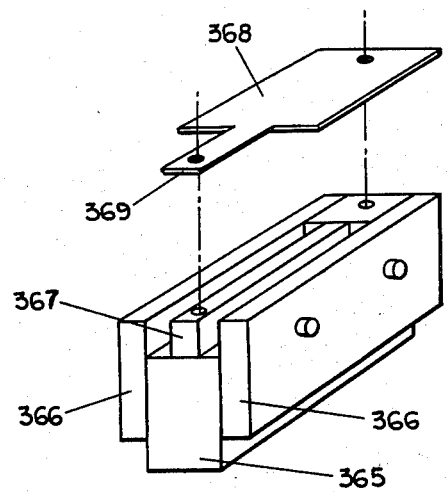
FIGS. 20A, and 20B are partial views of the solder assembly fountain.
Figure 20B:
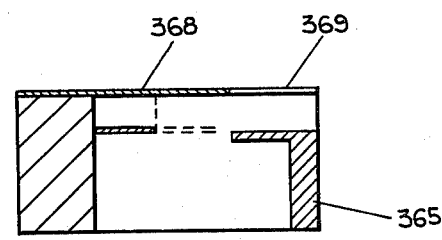

The solder fountain assembly is illustrated in FIG. 20A and comprises a hollow base housing 365, a pair of side plates 366 attached thereto, a divider bar 367 and a top plate 368 with a flow shaper flange 369. The sides of the flange 369 are at an angle with respect to the plane of the top and bottom surfaces of the flange to shape the flow direction of the solder. The angle L will generally be about 45° so that the solder patten is 45° to the horizontal. As illustrated in FIG. 20B the base housing 365 extends back to the end of flange 369 so that the liquid solder is pumped forwardly in the manner illustrated in FIG. 20B.

The vertical position of the fountains is adjusted by adjusting the position of entire assemblies 20 with respect to the frame 12. As illustrated in FIG. 1, the solder assemblies are mounted on a baseplate 21 which is mounted to the frame 12 through threaded adjusting screws 19.

In the operation of the equipment, the conveyor belt moves intermittently to move the leads 20 through the flux and solder fountains. The leads pause for approximately a one second time interval in the flux and solder fountains.

Finger Pick-Off Assembly

Figure 21:
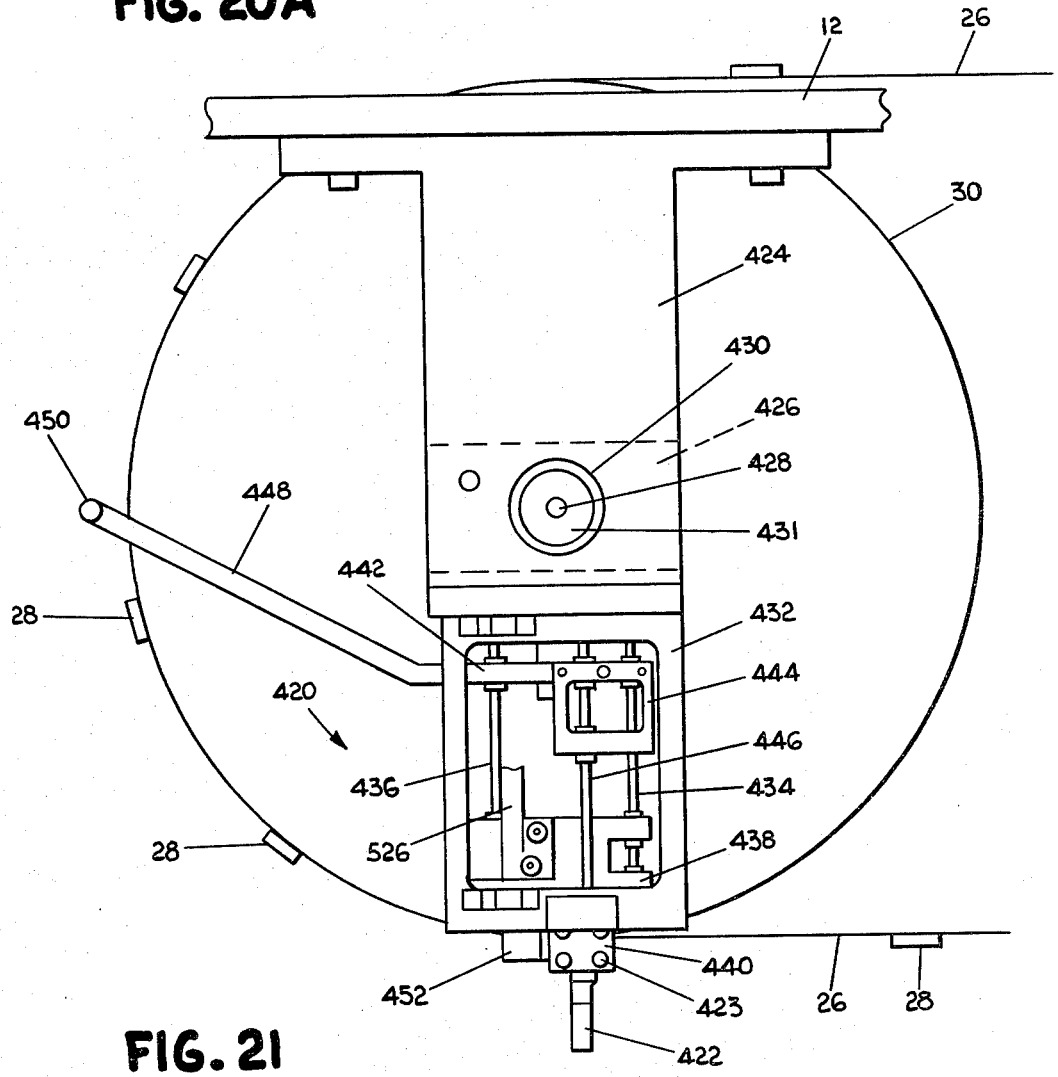
FIG. 21 is a sectional view through lines 21—21 of FIG. 3.
Figure 22:
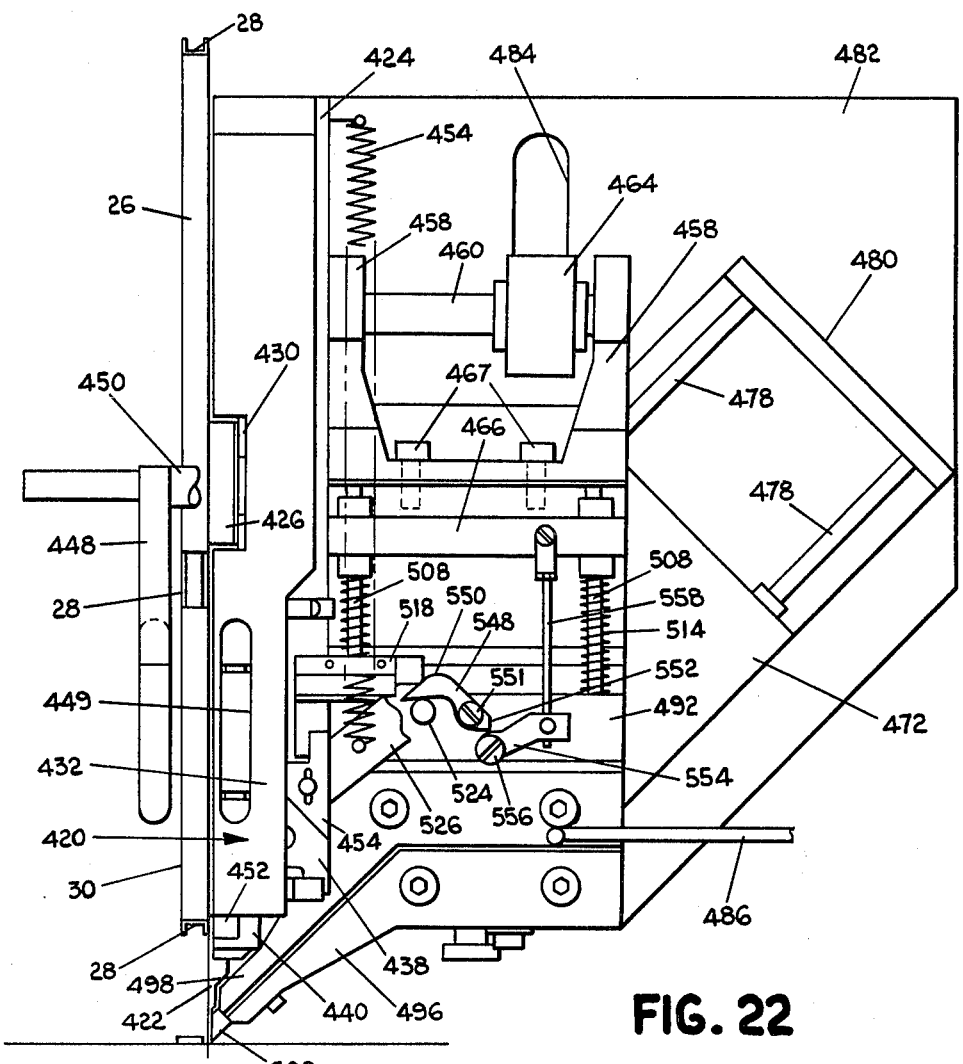
FIG. 22 is an enlarged partial end view, like FIG. 3, showing one-half of the pick-off fingers and reflow solder assembly.

Reference is now made to FIGS. 21 and 22 for a description of the finger pick-off assembly which is generally indicated by the numeral 420. A wheel housing 424 is mounted to the underside of frame 12 through suitable bolts and supports an axle 428 for the sprocket wheel 30 through bearings 430. The retainer plate 426 is secured to the inside of the wheel housing 424 to retain the bearings 430. A suitable hub 431 is threadably secured to the outer end of the axle 428 to retain the bearings between the retainer plate 426 and the hub 431.

Both of the finger pick-off assemblies 420 are identical and only one such assembly has been shown in FIGS. 21 and 22. A frame 432 is secured to the underside of the wheel housing 424 and mounts a pair of guide shafts 434 and 436. A finger carriage 438 is mounted within the frame 432 and on the guide shafts 434 and 436 through roller bearings so that the finger carriage 438 is reciprocably mounted on the guide shafts 434 and 436. A mounting plate 440 is secured to the underside of the finger carriage 438 and mounts magnetic finger 422 through socket head cap screws 423. As illustrated in FIG. 22, the pick-off finger 422 has a very thin blade-like bottom portion and a relatively thicker upper portion. Finger 422 is magnetic so that it can magnetically support the leads 70 of the integrated circuits 68. It will be evident that the magnetic finger 422 is shown in its lower position in FIGS. 21 and 22 and is shown in its uppermost position in FIG. 3.

A manual slide platten 442 is mounted on the guide shafts 434 and 436 through roller bearings for vertical reciprocal movement thereon. A pusher plate 444 is mounted on the slide pattern 442 and extends downwardly therefrom in a position for contact with the finger carriage 438. A guide shaft 446 is mounted in the frame 432 and extends through the pusher plate 444 and the manual slide platten 442. Lower bushings are provided between the guide shaft 446 and the pusher plate 444 and the manual slide platten 442. Lever arm 448 is secured to the manual slide platten 442 at one end thereof and extends through a slot 449 in the frame 432. A handle 450 is mounted at the outer end of the lever arm 448 and extends to a lever arm similar to a lever arm 448 on the other pick-off assembly 420. Thus, by depressing the handle 450, the manual slide platten 442 will be moved downwardly on guide shafts 434, 436 and 446.

In operation of the pick-off assemblies 420, the fingers 422 are initially positioned above the integrated circuits 68 which are magnetically held in the upside-down condition by the magnetic holders 28 as the magnet holders are driven to a location above the X-Y table 24. The conveyor belt 26 will index the integrated circuit 68 to a position directly beneath the magnet fingers 422. Desirably, a stop 452 is provided on frame 420 to establish the position in the leads 70 once again in the "Y" direction. The finger carriage 438 will then be moved downwardly, in a manner which will be described hereafter, so that the magnetic fingers 422 will be driven against the leads 70 to strip the integrated circuit 68 from the magnetic holder 28. Because the magnetic fingers 422 are magnetized, the leads 70 will be held fast thereto as the finger carriage 438 is driven downwardly to the position illustrated in FIG. 21. At this point, the fingers 422 will be only slightly above the integrated circuit board on the X-Y table 24. In this position, the leads 70 are positioned a few thousands of an inch above the printed circuit board. The leads will be held in this position until they are stripped from the magnetic fingers by the reflow electrodes in a manner which will be described hereafter. Subsequent thereto, the fingers will be retracted to the uppermost position above the holders 28 at the bottom of the conveyor run.

Reflow Electrode Assembly

Figure 23:
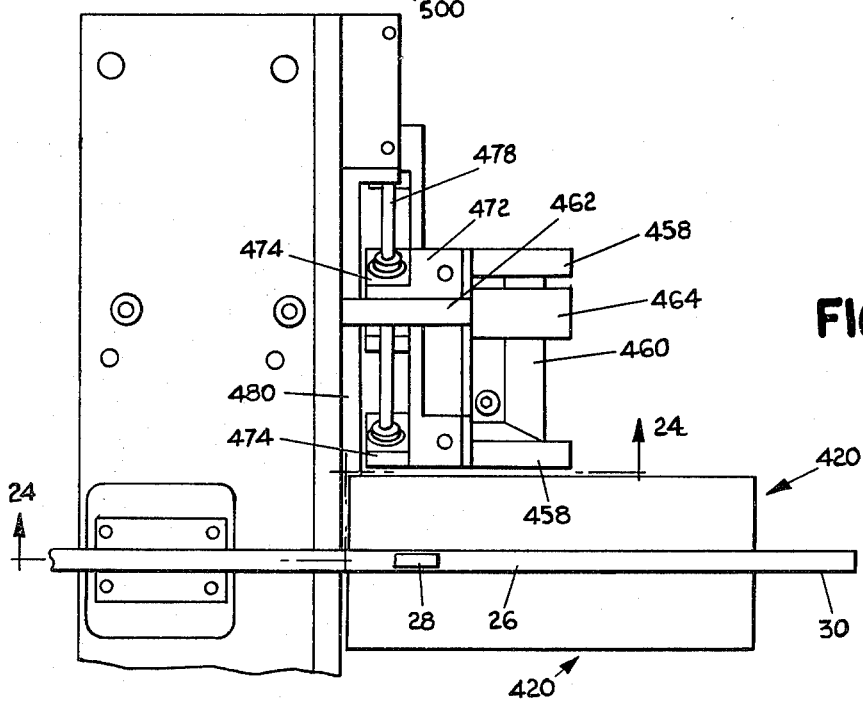
FIG. 23 is an enlarged partial plan view of the IC remover and reflow solder assemblies.
Figure 24:
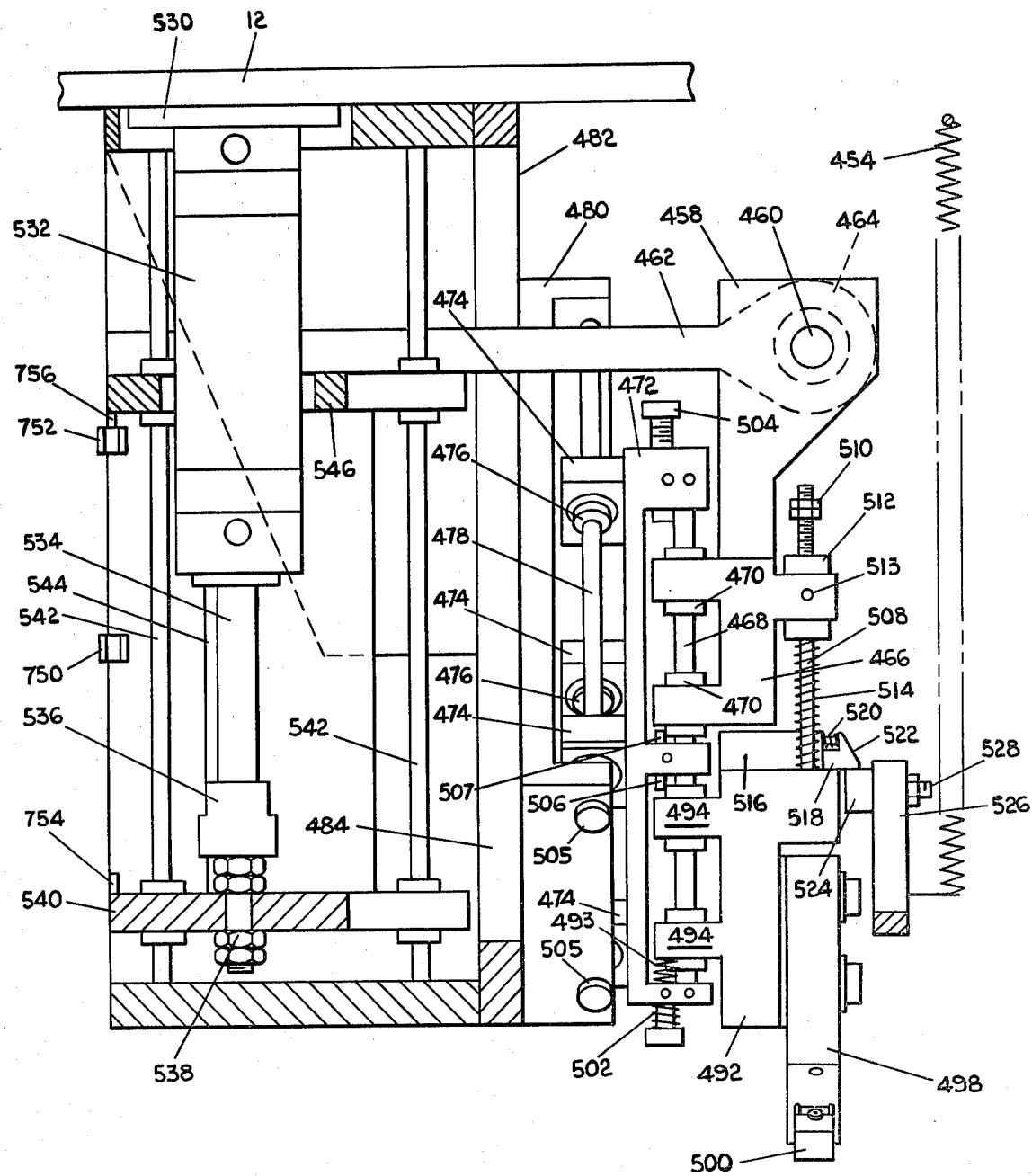
FIG. 24 is a partial sectional view taken along lines 24—24 of FIG. 23, showing the reflow solder assembly.

Referring now to FIGS. 22-24, a reflow electrode assembly will be described. Two identical reflow assemblies are provided. However, only one such assembly is shown in FIGS. 22-24 and only one such assembly will be described.

A pair of arm brackets 458 support a guide shaft 460. A connector rod 462 is mounted on the guide shaft 460 through a roller bearing 464. A spring carrier 466 is secured to the bottom of the arm brackets 458 through bolts 467. A pair of guide rods 468 are mounted on a bracket 472 through ball bushings 470. The bracket 472 has four 45° flanges 474 which are mounted at a 45° angle to the vertical. A pair of 45° guide shafts 478 slide within the brackets 474 through ball bushings 476. The guide shafts 478 are mounted on a mounting bracket 480 which is secured to a hanger frame 482. The hanger frame 482 is secured to the main frame 12 through conventional fasteners such as bolts or welds (not shown). Slots 484 is provided in the hanger frame 482 and the connector rod 462 extends therethrough. A reflow carriage 492 has a pair of bushed flanges 494 through which the carriage 492 is slidably mounted on the guide rods 468. A pair of reflow heads 496 and 498 are secured to the reflow carriage 492 and are electrically joined through an electrode 500. Electrical current through leads (not shown) is supplied in controlled pulses to the reflow heads 496 and 498 from a power supply (not shown). Air under pressure is supplied from a source (not shown) in controlled amounts through air hose 486 to cool the soldered joints. The air is introduced into the reflow head 498 and passes through a channel (not shown) between the reflow heads 496 and 498 to the electrode 500. The air thus cools the electrode 500 and, by so doing, cools the solder joint.

A threaded adjusting screw 502 is threaded through the bottom of the carriage 492 and mounts a spring 493 which abuts the lowermost bushed flange 494 to bias the reflow carriage 492 upwardly with respect to the bracket 472. An adjusting screw 504 is threaded through a hole in the upper part of bracket 472 to limit the upward movement of the spring carrier 466 with respect to the bracket 472. A threaded adjusting screw 506 is mounted at a central part of the bracket 472 and extends downwardly into abutting relationship with the upper end of bushed flanges 494 to limit the upward movement of the reflow carriage 492 with respect to the bracket 472. In like manner, a threaded adjusting screw 507 is threaded into a central portion of the bracket 472 and extends upwardly therefrom into abutting relationship with the spring carrier 466 to limit the downward movement of the spring carrier 466 with respect to the bracket 472. Threaded stops 505 are threaded through the bottom of bracket 480 in abutting relationship with flanges 474 to limit the downward 45° movement of bracket 472 with respect to mounting bracket 480.

The guide shaft 508 has a threaded lower end by which the shaft 508 is mounted to the reflow carriage 492. The upper portion of the shaft 508 extends through an adjustable bushing 512 which is mounted in a flange of the spring carriage 466. The upper end of the shaft 508 is threaded and has adjusting nuts 510 mounted thereon to limit the downward movement of the shaft 508 with respect to the bushing 512. The bushing is adjustably mounted in the spring carrier 466 flange through a set screw 513. A compression spring 514 is mounted between the adjustable bushing 512 and the top surface of the reflow carriage 492 to provide a spring loading of the spring carrier 466 with respect to the reflow carriage 492.

A finger 518 is slidably mounted for lateral movement on the top of a reflow carriage 492 through a retainer plate 516. The finger 518 and retainer plate 516 are laterally spaced with respect to the shaft 508 and the spring 514 so that there is no interference between the spring 514 and the finger 518. A compression spring 520 is mounted between the end of the finger 518 and the retainer plate 516 to spring bias the finger 518 outwardly with respect to the plate 516. The finger 518 has an outer cam surface 522, a bottom portion of which abuts cam roller 524 which is attached to a connecting link 526 and a bolt 528. The connecting link 526 is secured to pick-off assembly 420 finger carriage 438 as seen in FIG. 22. As seen in FIGS. 22 and 23, a tension spring is mounted on the connector link 526 at its lower end and to the finger pick-off frame 432 at its upper end to bias the finger carriage 438 upwardly with respect to frame 432.

As best seen in FIG. 22 in which a portion of connector link 526 is broken away, a spring-loaded rotatable link 548 is pivotably mounted on reflow carriage 492 through pivot pin 551. Link 548 has a cam surface 550 at one end in alignment with the underside of finger 518 and at the other end a pointed end 552 which engages a socket in an actuating lever 554. A pivot pin 556 pivotably mounts the activating lever 554 to the reflow carriage 492. A connecting link is mounted to the spring carrier 466 at one end and to one end of the actuating lever 554 at the other end.

An air cylinder 532 is mounted to the frame 12 through a support 530 and has an extendible rod 534 which is connected to a bottom plate 540 through an adapter 536 and a threaded rod 538 with jam nuts secured thereto. The threaded rod 538 is secured to the bottom of the adapter 536 and jam nuts are used to adjustably position the bottom plate 540 with respect to the cylinder 532. A pair of guides 542 extend between the bottom and top of the hanger frame 482 and mount the bottom plate 540 through ball bushings so that the bottom plate 540 is freely slidable on the guides 542. A top plate 546 is mounted for reciprocal movement on the guides 542 and is connected to the bottom plate 540 through a connector rod 544. The connector rod 462 extends through slots 484 in the frame 482 and is secured to the top plate 546 through conventional bolts shown in phantom lines.

A pair of photon coupled interrupter modules 750 and 752 are mounted on the hanger frame 482 adjacent the bottom plate 540 and the top plate 546 respectively. An interrupter tab 754 is mounted on the bottom plate 540 for registry with the module 750 when the rod 534 is retracted. An interrupter tab 756 is mounted to the top plate 546 in registry with the interrupter module 752 when the rod 534 is extended as illustrated in FIG. 24. The interrupter modules 750 and 752 are electrically coupled to the control unit 38 to control the operation of the air cylinder 532.

In operation of the reflow solder assembly, the cylinder 532 is driven to extend the rod 544, thereby driving the plates 540 and 546 downwardly with respect to the frame 482. At the same time, the connector rod 462 moves downwardly, thereby dropping the arm brackets 458, the spring carrier 466, the bracket 472 and the reflow carriage 492. As noted above, the bracket 472 is mounted on the 45° guide shafts 478 so that the reflow heads 496 and 498 move inwardly as they move downwardly. As the reflow carriage 492 moves downwardly, the roller 528 rolls on the underside of finger 518, thereby driving the pick-off finger assembly 420 downwardly. As the rod 534 reaches the bottom of the stroke, pick-off finger assembly 420 reaches the bottom of its movement as the finger carriage 438 strikes the bottom of the frame 432. At this point, the flanges 474 of bracket 472 bottom out on threaded stops 505. The reflow carrier 492, however, continues to move downwardly, but now vertically on guide rods 468 against the pressure of the spring 514. Electrodes 500 thus move closer to the circuit board and contact the leads to strip the integrated circuit from the magnetic fingers 422. During this last vertical movement of the reflow carrier 492, the cam roller 524 rolls onto the cam surface 550 of rotatable link 548 as seen in FIG. 22. Further downward movement of the spring carrier 466 with respect to the reflow carrier 492 rotates actuating lever 554 clockwise to release engagement with rotable link 548. The upward pressure on link 548 by cam roller 548 pivots the link about pin 551 to release the cam roller 524. The finger carriage 438 immediately moves upwardly under the tension of spring 454 with the roller 524 passing by the lever 548.

As previously mentioned, the electrodes 500 carry the leads to an accurate position on the circuit board. During the last movement of the electrodes 500 on the 45° movement, the electrodes come into contact with the IC leads 70. If the IC is not centered on the pick-off fingers 422, the 45° movement serves to center the IC and establish the correct "X" axis position of IC. Electrical energy is thereafter supplied to the reflow heads 496 and 498 to heat the electrodes 500, thereby melting the solder on the leads 70. After a short time interval which is determined by the computer, during which time the solder melts, the electrical power is terminated. However, the electrodes 500 are maintained in place until the solder has cooled and hardened. In order to assist in the cooling process, air under pressure is supplied through a duct between the reflow heads 496 and 498. After a second short interval of time during which the solder solidifies, the cylinder 532 is actuated to retract the rod 534 and thereby raise the reflow solder assembly. In this upward movement, cam surface 522 cams over the roller 524 to retract the finger 518 and return the roller to the position illustrated in FIG. 24 beneath the finger 518.

X-Y Axis Table

Figure 25:
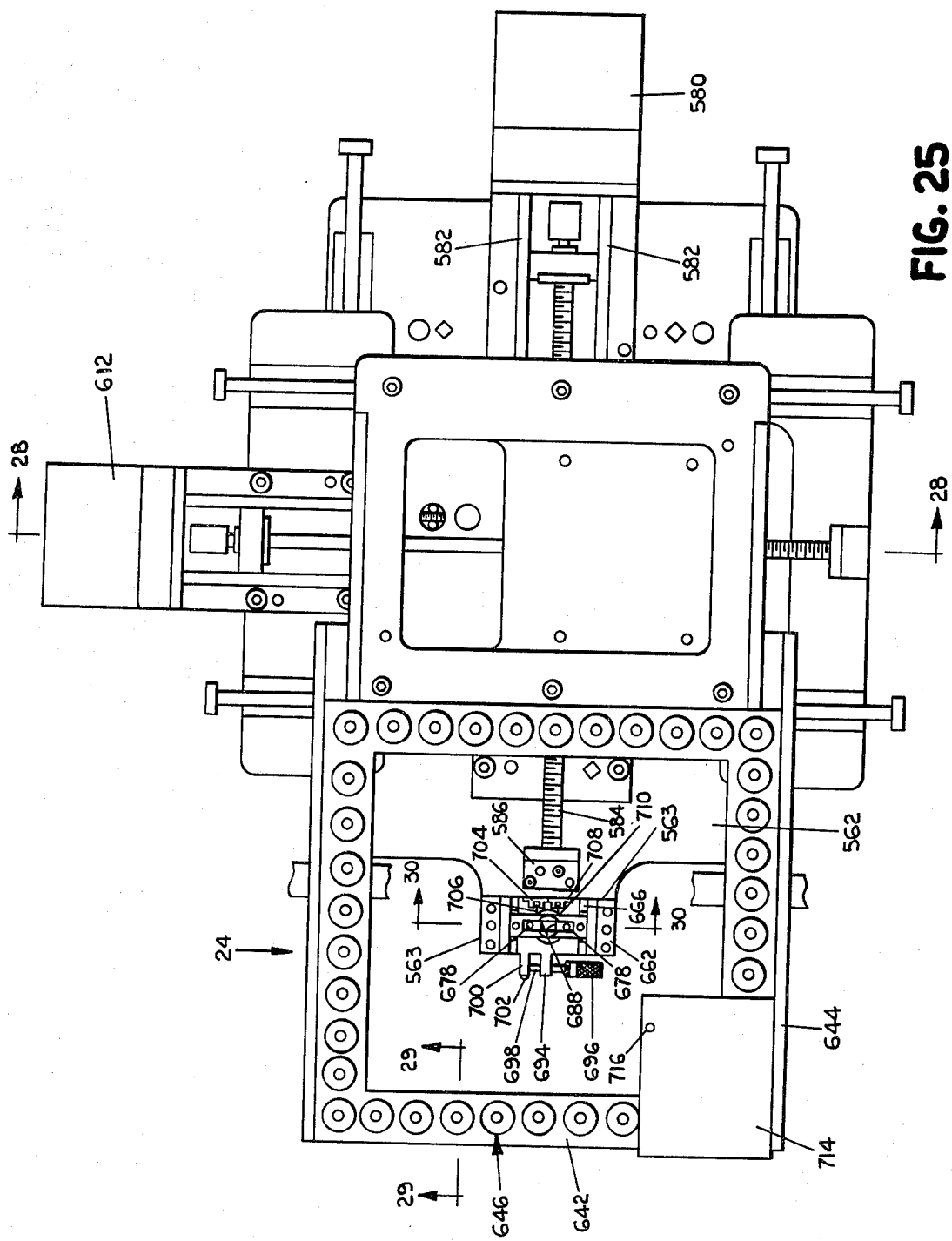
FIG. 25 is an enlarged plan view of the X-Y table seen along lines 25—25 of FIG. 3.
Figure 28:
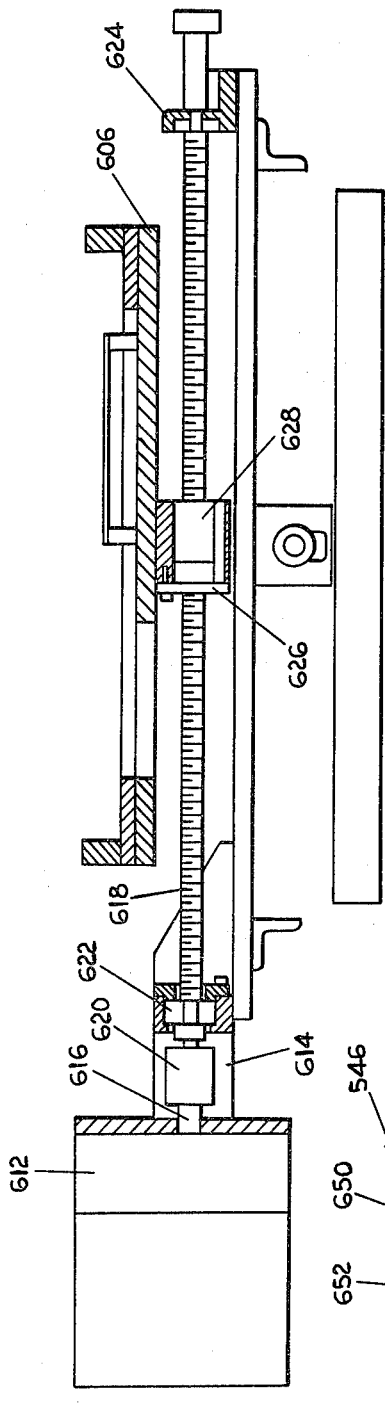
FIG. 28 is a partial sectional view along lines 28—28 of FIG. 26.

Referring now to FIGS. 25 through 28 for a description of the X-Y table assembly 24, frame supports 560 support a base plate 562 through machine bolts 564. The base plate 562 has a forward projection 563 as illustrated in FIG. 25. Elongated rod supports 566 are mounted on the base plate 562 through machine bolts 568. Guide rods 570 are secured to the elongated rod supports 566 through screws (not shown). A first movable plate 572 is mounted on the guide rods 570 through pillow blocks 574 and open bearings 576. Bolts 578 secure the pillow blocks 574 to the first movable plate 572.

An indexing synchronous motor 580 is mounted on the base plate 562 through bracket supports 582 in conventional fashion. A ball screw 584 is coupled to the output of the synchronous motor 580 at one end and is supported at the other end through a bracket 586. A ball nut assembly 588 is secured to the underside of the first movable plate 572 and is threaded onto the ball screw 584 so that the first movable plate 572 is driven along the length of the ball screw 584 on the guide rods 570 as the ball screw 584 is rotated by the synchronous motor 580.

Photon coupled interrupter modules 590, 594 and 598 are mounted onto the base plate 562 in registry with interrupter tabs 592, 596 and 600 respectively. The photon coupled interrupter modules 590, 594 and 598 are coupled to the computer and signal the computer as to the precise location of the first movable plate 572 with respect to the base plate 562.

In a manner identical to the mounting of the first movable plate 572 to the base plate 562, a second movable plate 606 is mounted to the first movable plate 572. Specifically, elongated guide rods 604 are mounted on elongated supports 602 on the top of the first movable plate 572. Open pillow blocks 608 which are secured to the underside of the second movable plates 606 have open bearings 610 which partly encircle and ride on the elongated guide rods 604.

An indexing synchronous motor 612 supported by bracket supports 614 has an output shaft 616 which is connected to a threaded ball screw rod 618 through a flexible coupling 620. Bearings 622 mounted between the bracket supports 614 support the ball screw rod 618 at one end and bracket support 624 having a bearing supports the ball screw rod 618 at the other end thereof. A ball nut 628 is mounted on the underside of the second movable plate 606 through a depending flange 626 in registry with and threaded onto the threaded ball screw rod 618. Thus, as the motor 612 rotates the ball screw rod 618, the second movable plate 606 will be translated to the left or right as viewed in FIGS. 27 and 28 on the guide rods 604.

Photon coupled interrupter modules 630, 632 and 634 are mounted on the first movable plate 572 in registry with interrupter tabs 636, 638 and 640 which are mounted to the underside of the second movable plate 606. The interrupter modules 630, 632 and 634 are coupled to the computer to give precise locations of the second movable plate 606 with respect to the base plate 562. The location of the first movable plate 572 and the second movable plate 606 with respect to the base plate 562 fixes a precise location of the X-Y axis table with respect to a predetermined reference point. Thus, the computer will be able to precisely fix the position of the X-Y table with reference to a particular location, i.e. the IC remover and reflex solder assembly. The synchronous motors 580 and 612 are likewise coupled to the computer control unit 38 and are operated thereby. Thus, movement of the table along the X axis (to the left or right as viewed in FIGS. 27 and 28) or along the Y axis (to the left or right as viewed in FIGS. 25 and 26) is tracked by the computer control unit 38 and the precise location of a board on the X-Y table is tracked with reference to the IC remover and reflex solder assembly 22.

A circuit board table 642 is mounted on and cantilevered from the second movable plate 606 through bracket supports 644. The circuit board table 642 comprises an open rectangular ferromagnetic metal frame having a plurality of electromagnetic assemblies 646 mounted around substantially the entire periphery thereof.

Figure 29:
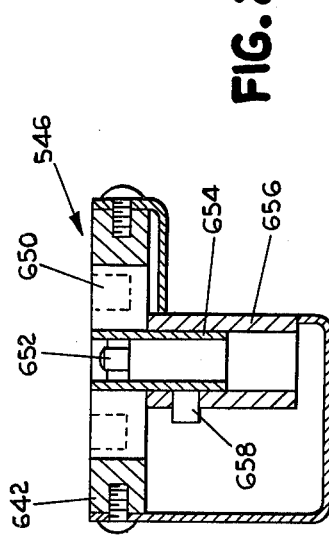
FIG. 29 is a partial sectional view along lines 29—29 of FIG. 25.

With reference to FIG. 29, each electromagnetic assembly 646 comprises a snubber core annular magnet 650 and a photocell 652 mounted centrally thereof. The photocell 652 is mounted in a cylindrical photocell holder 654 which in turn is mounted in a cylindrical support 656 through a set screw 658. A guard 648 is mounted to the underside of the table frame to protect the photocells 652. Each of the photocells 652 is coupled to a control unit (not shown) for operating the electromagnets 650. When a circuit board support is placed over the photocell, the electromagnets are actuated to magnetically hold the support. A computer controlled "positioning mode" reduces the amounts of magnetic flux generated by the electromagnets during times when positioning of the circuit board supports is required. The small level of magnetism allows for maneuvering and positioning of the circuit board supports when the retainers are being mounted on the table 642. The higher level of magnetism achieved by the electromagnets assembles 646 provides for firm gripping of the circuit board support after they have been correctly positioned in the desired location on the table 642.

Circuit Board Support Assembly

Figure 30:
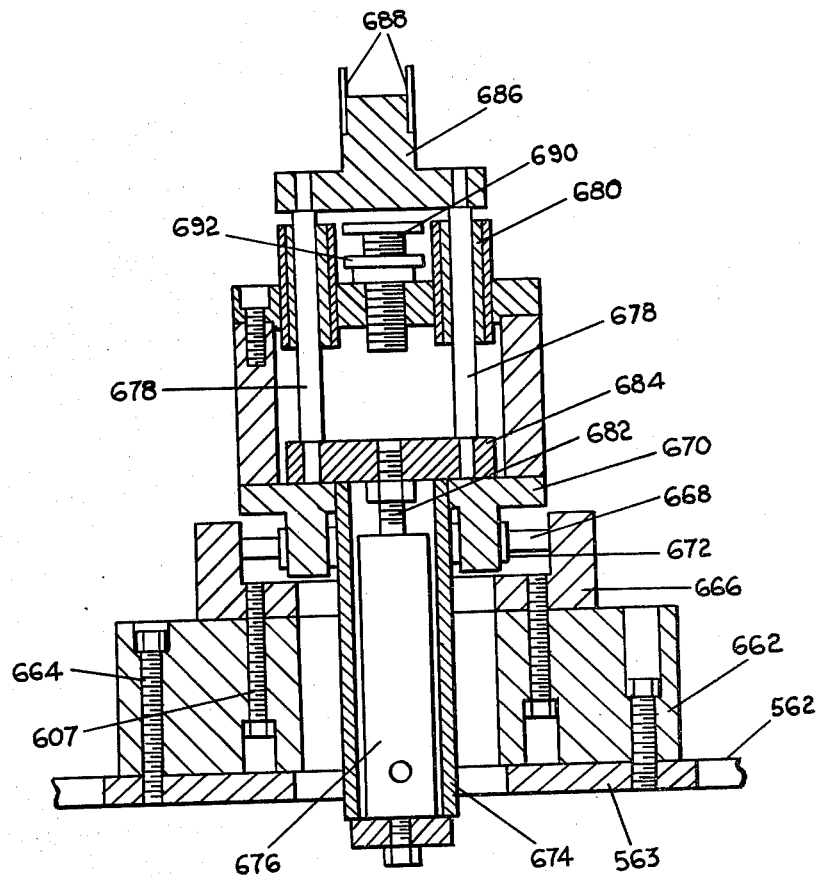
FIG. 30 is a partial sectional view along lines 30—30 of FIG. 25.

Reference is now made to FIGS. 25, 26 and 30 for a description of the bottom support for a circuit board during the reflow operation. Riser 662 is mounted to the projecting flange 563 of the base plate 562 through bolts 664. A base 666 is mounted on the riser 662 through bolts 667. A pair of support rods 668 extend horizontally on the base 666 and mount a carrier frame body 670 through bearings 672. A cylindrical tube 674 is mounted to the carrier frame body 670 and extends downwardly therefrom through the opening in the projecting flange 563. An air cylinder 676 is mounted within the cylindrical tube 674. A pair of pusher shafts 678 extend through the upper part of the carrier frame body 670 and are slidably retained therein through bearings 680. A cylinder rod 682 extends from the air cylinder 676 and is secured to a bottom plate 684. The two pusher shafts 678 are mounted between the bottom plate 684 and the top plate 686. A pair of rectangular support plates 688 extend upwardly from the top plate 686 in a location directly beneath the electrodes 500 (FIG. 24) but on the obverse side of the circuit board. A knurled screw 690 is threaded into the top of the carrier frame body 670 and locked in place by a knurled nut 692 which is threaded onto the knurled screw 690. The bottom of the knurled screw 690 provides a stop for the bottom plate 684 to limit the upward movement of the support plates 688 so that the top surfaces of the support plates 688 are positioned precisely at the bottom surface of the circuit board on the X-Y table.

A riser flange 694 extends forwardly from the riser 662 and mounts a micrometer 696 which has a conventional extensible rod 698. A carrier flange 700 extends forwardly from the carrier frame body 670 and mounts a clip 702 which retains the end of the micrometer rod 698. Adjustment of the micrometer will adjust the lateral position of the carrier frame body 670 with respect to the base 666 and, in so doing, adjusts the lateral position of the support plates 688 with respect to the reflow electrodes 500. In this manner, the support plates 688 can be precisely positioned to be in registry with the electrodes 500.

The upper photon coupled interrupter module 704 and a lower photon coupled interrupter module 708 are mounted on the frame 670. Interrupter tabs 706 and 710 are mounted on the bottom plate 684 to register with the modules 704 and 708 respectively as the bottom plate 684 moves upwardly and downwardly. The photon coupled interrupter modules are coupled electrically to the computer so that the computer has a positive input signal when the support plates 688 are positioned in supporting location beneath the circuit board and when the support plates 688 have been retracted into the position illustrated in FIG. 30.

In operation, the air cylinder 676 is actuated by the computer to extend the cylinder rod 682, thereby extending pusher shafts 678 and support plates 688 to a position in supporting relationship to the circuit board. This operation takes place prior to stripping of the integrated circuit from the carrier and the support plates 688 are retained in position until after the re-flow operation is completed. Thus, after the re-flow electrodes 500 are raised, the support plates 688 are lowered to permit movement of the circuit board to a new location. Thus, the support plates 688 provide a firm foundation beneath the circuit board precisely below the electrodes so that the electrodes can press against the circuit board for an effective soldering operation.

Circuit Board Positioning Supports

Figure 33:
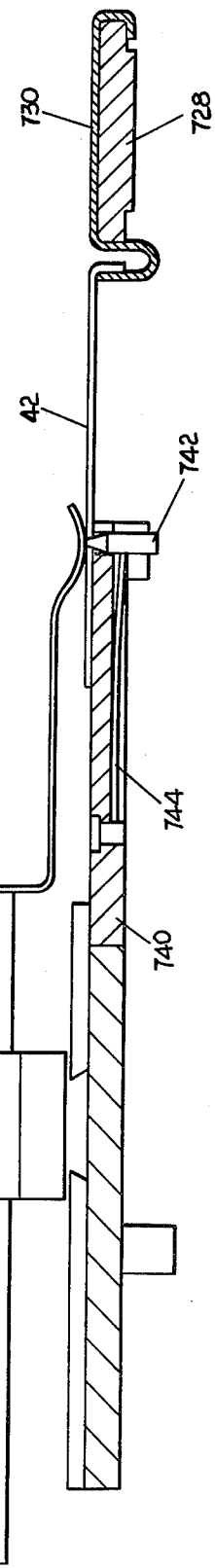
FIG. 33 is a sectional view taken along lines 33—33 of FIG. 32.
Figure 32:
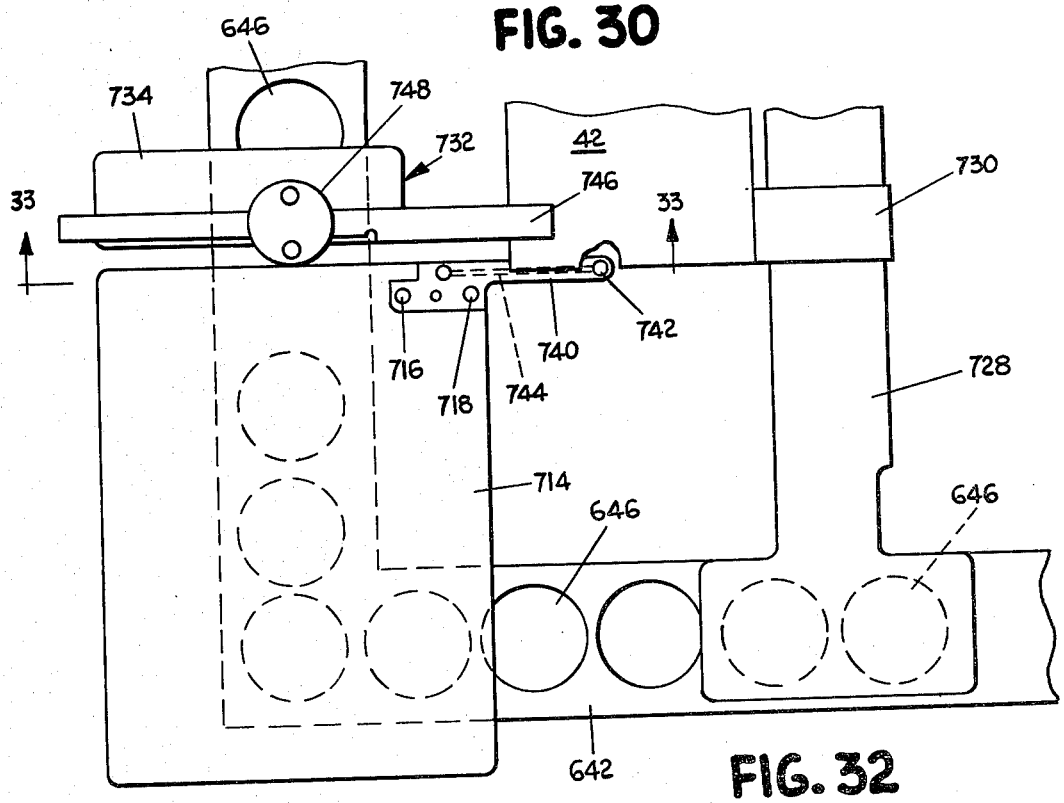
FIG. 32 is a view of the X-Y table, showing the positioning fixtures in place.

Referring now to FIGS. 32 and 33, the manner in which the printed circuit board is secured to the X-Y axis table is illustrated. A board positioning plate 714 is positioned at the two forward corners of the circuit board table 642. The plate 714 mounts a projecting arm 740 at the corner thereof through pins 716 and 718. A pin 742 tapered at the top so it is self centering is resiliently mounted on a leaf spring 744 shown in phantom lines in FIG. 32 in a central portion of the projecting arm 740. The pin 742 registers with a precise positioning hole in the printed circuit board 42. Thus, the projecting arm 740 supports the front edge of the printed circuit board 42 and the position of the board is fixed by the positioning pins 742. A board hold down assembly 732 comprises a support plate 734 which is retained on the circuit board table 642 through the electromagnetic assemblies 646. A spring lever 746 is slidably mounted to a rotatable support 748 on the support plate 734 and extends out over the circuit board to force and maintain the circuit board in contact with the projecting arms 740.

Figure 31:
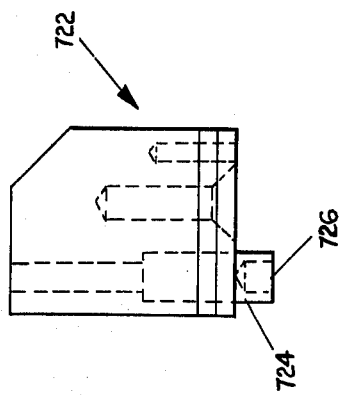
FIG. 31 is an elevational view of a nesting fixture used in positioning the board-holding fixtures on the X-Y table.

Reference is now made to FIG. 31 for a description of a nesting fixture by which the circuit board positioning means are accurately positioned and indexed into the computer. The nesting fixture 722 is secured into the frame 432 between the two pick-off fingers 422. The nesting fixture comprises downwardly extending pilot member 724 having a clearance hole 726. With the nesting fixture 722 in the frame 432, the handle 450 is pulled downwardly until the pilot member 724 is positioned near the table. The X-Y axis table circuit board table 642 is moved by the control unit 38 to a preselected position. One plate 714 is moved until the pilot member 724 is positioned within the hole in arm 740 for the pin 742. The frame 432 then returns to its uppermost position and the computer moves the X-Y table to a new location which corresponds to the location of another hole in the printed circuit board. This new position is dialed into the control unit through the CRT display 40. Handle 450 is again pulled down until the pilot member 724 is near the X-Y table. Another positioning plate 714 is then moved until the pilot member 724 fits within the hole in the other arm 740 for the pin 742. Full current is then applied to the electromagnets to firmly fix both of the positioning plates 714 in place. As indicated above only those electromagnets beneath the plates 714 are activated. The rear support is then positioned in the desired location. The circuit board is then positioned on the two pins 742 at one end and on the rear support 728 at the other end, with the rear lip of the board 42 fitting within the groove on the clip 730. The board hold down assemblies 732 are positioned on the table 642 and held in place by the elecromagnetic assemblies 646. The ends of the spring levers 646 are then moved over the board 42 to hold the board in place on the supports.

The combination of the positioning plates 714, rear support 728 and hold down assembly 732 provide a universal fixture for different sizes and types of circuit boards. This system eliminates the need for hard tooling for each size and configuration of circuit board.

The Control Unit

The functions of the control unit 38 have been described above. The control unit itself comprises a programmable computer having a storage capacity of 32,000 bits. An example of such a computer is a Computer Automation Model 4/10. The computer operates the CRT display and keyboard unit 40 and is also controlled by inputs from the CRT display and keyboard unit 40. The controller is used in conjunction with limit switches to control the various functions of the machine.

By way of recapitulation, the controller maintains inventory control of integrated circuits in the sequencer 14. It detects the home or reference position of the sequencer through interrupter module 116 and controls the position of the sequencer through motor 110. It controls the dispensing from the sequencer 14 through air cylinder 128 as detected by interrupter modules 146 and 144. It detects the orientation of the flat packs as they are dispensed from the sequencer to the decapper through the infrared photosenser 184 and also detects the presence of the integrated circuit on the carrier with the centrally disposed infrared sensor 184. It operates the decapper through air cylinder 152 as detected by interrupter modules 166 and 214. It operates the centering mechanism through air cylinder 378 utilizing interrupter modules 406 and 408. It operates the die-forming apparatus through air cylinders 236 and 266 as detected by interrupter modules 279, 294 and 296. It operates a scrap removal function in the lead-forming operation through air cylinder 314 utilizing interrupter modules 320 and 327. It operates the fluxsolder pots to maintain them at a predetermined temperature. It monitors the presence of an integrated circuit on the magnetic holder 28 as the magnetic holder approaches the integrated circuit remover and reflow solder assembly through scanner 43. It operates the IC remover and reflow solder assembly through air cylinder 532 utilizing interrupter modules 750 and 752. It operates the electrodes 500 and controls the supply of cooling air to the electrodes through air hose 486. It controls the operation of the X-Y axis table by controlling motor 612 utilizing interrupter modules 630, 632 and 634 to determine home or a reference position, and operating motor 580 utilizing interrupter modules 590, 594 and 598 for home or reference position. It operates the circuit board support assembly through air cylinder 676. Finally, it controls the indexing of the conveyor through the motor 34.

The invention provides an integrated operation for complete assembly of a circuit board on an automated bases by simply loading flat pack integrated circuit assemblies as they are received by the manufacturer into the machine and correctly positioning the printed circuit board. A single operator can operate the machine and the machine can solder at the rate of 10 integrated circuits per minute. Because of the magnetically linked holding, transporting and positioning of the integrated circuit flat packs, lead location is predictable. The need for a visual position check and probable position correction is eliminated. With the use of the magnetic holder 28 as a portion of the forming die and the use of the leads for handling the integrated circuit, varying body shapes and dimensions can be easily accommodated with the machine. The Y axis location of the integrated circuits on the carriers is easily established by overdriving the lead at stops along the way. The magnetic coupling of the leads to the holders maintains the integrity of the Y axis position during the flux-and-solder operations and during the transfer to the printed circuit board.

The X axis position of the integrated circuits is controlled by the position of the leads on the magnetic holders and further is reaffirmed by the 45° descent of the reflow electrodes 500. The fountain design in the flux-and-solder pots controls the width and depth of the flux and tinning of the leads. The magnetic photocell assemblies on the X-Y axis table along with the special circuit board holding tools provide universal application to different sizes and shapes of circuit boards, thereby eliminating the need for hard tooling. The integrated operation avoids separate and distinct handling steps of the integrated circuits. Further, the particular shape of the leads, while important for transporting and handling the integrated circuits enhances the vibration resistance of the integrated circuits in use. Further, the multiple bends eliminate the need for manual touch-up to remove solder from the bend joints when stress relief on single-bend IC's is used as in previous systems.

Reasonable variation and modification is possible within the scope of the foregoing disclosure, drawings and appended claims without departing from the spirit of the invention.

The embodiments of the invention in which an exclusive property or privilege is claimed are defined as follows:

1. In an apparatus for assembling integrated circuits having a body and a plurality of leads extending therefrom onto a printed circuit board comprising a plurality of solder-containing pads designed to receive the integrated circuit leads, wherein the leads of the integrated circuits are tinned and bent downwardly and laterally to form feet to contact the printed circuit pads;

a table for mounting a printed circuit board;

electrode means for soldering the integrated circuit leads to the printed circuit board at a predetermined location on the table;

means for positioning the integrated circuits on the printed circuit board at the predetermined location for soldering by the electrode means; and means for intermittently moving the table with respect to the electrode means to position different areas of the printed circuit board at the predetermined location beneath the electrode means;

the improvement which comprises:

a frame;

a continuous conveyor means mounted on the frame and having a plurality of spaced support means to support and retain integrated circuits by the leads thereof;

means mounted on the frame for dispensing integrated circuits seriatim onto the integrated circuit support means so that the integrated circuits are supported thereon by the leads;

means on the frame operably associated with the conveyor means for bending the leads downwardly and outwardly to form feet on the leads for contact with the printed circuit board while the leads are supported by the conveyor means integrated circuit support means;

means on the frame in proximate relationship with the conveyor means for coating the leads with solder while the integrated circuits are retained by the integrated circuit support means;

the integrated circuit positioning means comprising means for transferring the integrated circuits from the support means to the printed circuit board on the printed circuit board table into the predetermined location for soldering by the electrode means; and means for intermittently moving the conveyor means so that the integrated circuit support means move sequentially from the dispensing means to the lead-forming means, the solder coating means and the transferring means.

2. An apparatus for assembling integrated circuits according to claim 1 wherein the integrated circuit dispensing means comprises a carriage rotatably mounted on the frame, a plurality of channels adapted to receive integrated circuits mounted on the carriage and means for coordinating the dispensing of different integrated circuits with a different locations on the printed circuit board on the table.

3. An apparatus for assembling integrated circuits according to claim 2 wherein each integrated circuit in the carriage has a carrier and the dispensing means comprises means to separate the integrated circuits from the carrier.

4. An apparatus for assembling integrated circuits according to claim 2 wherein the dispensing means further comprises means to detect the orientation of the integrated circuits prior to placement on the integrated circuit support means, and means for generating an alarm signal if the integrated circuit is not positioned in a predetermined orientation.

5. An apparatus for assembling integrated circuits according to claim 1 wherein the dispensing means further comprises means to detect the orientation of the integrated circuits prior to placement of the same on the integrated circuit support means, and means for generating an alarm signal if the integrated circuit is not oriented in a predetermined orientation.

6. An apparatus for assembling integrated circuits according to claim 1 wherein the conveyor means support means comprises a U-shaped channel made of a magnetized material so that the ends of the U are spaced to receive the integrated circuit body therebetween with the integrated circuit leads supported thereon, whereby the integrated circuit leads are magnetically retained by the support means.

7. An apparatus for assembling integrated circuits according to claim 6 wherein the conveyor means is trained around sprockets having horizontal axes so that the conveyor means has an upper and lower run; the dispensing means is positioned at the upper run and positions the integrated circuits upside down on the U-shaped support means; and the solder-coating means is positioned beneath the lower run of the conveyor to coat the leads of the integrated circuits as the integrated circuits pass right side up along the lower run of the conveyor.

8. An aparatus for assembling integrated circuits according to claim 7 wherein the solder-coating means comprises means for pumping liquid solder metal in a fountain pattern in the path of the leads of the integrated circuits.

9. An apparatus for assembling integrated circuits according to claim 8 wherein the pumping means comprises means for directing the flow of the liquid solder in a direction countercurrent to the movement of the solder.

10. An apparatus for assembling integrated circuits according to claim 7 and further comprising means upstream of the solder-coating means for coating flux on the integrated circuit leads.

11. An apparatus for assembling integrated circuits according to claim 9 wherein the flux-coating means comprises a source of flux beneath the lower run of the conveyor and means for pumping the flux in a fountain pattern into the path of the leads as the integrated circuits pass along the lower run of the conveyor.

12. An apparatus for assembling integrated circuits according to claim 7 wherein the integrated circuit positioning means is positioned at the lower run of the conveyor, downstream of the solder-coating means.

13. An apparatus for assembling integrated circuits according to claim 12 wherein the integrated circuit positioning means comprises a pair of magnetic fingers; means for reciprocably mounting the magnetic fingers for movement from a first position above the leads on the U-shaped support means to a second position in close proximity to the table to strip the integrated circuits from the support means and carry the integrated circuits down to the table with the integrated circuits being magnetically supported by the magnetic fingers.

14. An apparatus for assembling integrated circuits according to claim 13 and further comprising means for retracting the magnetic fingers to the first position when the electrode means are soldering the leads to the circuit board to permit movement of the conveyor during the soldering operation.

15. An apparatus for assembling integrated circuits according to claim 13 and further comprising means mounting the electrode means to strip the integrated circuits by the leads thereof from the magnetic fingers at the circuit board.

16. An apparatus for assembling integrated circuits according to claim 14 and further comprising means to apply a timed pulse of air to the electrodes to cool the same subsequent to the application of electrical energy to the electrodes.

17. An apparatus for assembling integrated circuits according to claim 1 wherein the table comprises electromagnetic holding means and further comprising ferromagnetic means for holding the circuit boards.

18. An apparatus according to claim 17 wherein the ferromagnetic means comprises at least two separate support members each having a pin for engaging a locating hole in the circuit boards.

19. An apparatus for assembling integrated circuits according to claim 18 and further comprising a third support member for engaging an edge of the circuit board.

20. An apparatus for assembling integrated circuits according to claim 1 and further comprising means for supporting the circuit board at the predetermined location to provide a counter force for the electrode means.

21. An apparatus for assembling integrated circuits according to claim 20 wherein the circuit board support means has means for reciprocating mounting the support means so that it supports the circuit board when pressure is applied by the electrode means but is moved out of the support position when the table is moved.

22. An apparatus for assembling integrated circuits according to claim 1 wherein the lead-bending means has means for forming four bends in each lead.

23. An apparatus for assembling integrated circuits according to claim 22 wherein the leads are bent upwardly, laterally, downwardly and laterally of the body of the integrated circuits by the lead-bending means.

24. An apparatus for assembling integrated circuits according to claim 22 and further comprising means to trim the ends of the leads as they are bent by the lead-bending means.

25. An apparatus according to claim 24 and further comprising means to remove the ends of the leads from the trimming means.

26. In an apparatus for assembling integrated circuits having a body and a plurality of leads extending therefrom onto a printed circuit board comprising a plurality of solder-containing pads designed to receive the integrated circuit leads, wherein the leads of the integrated circuits are tinned and bent downwardly and laterally of the body to form feet to contact the printed circuit pads;
   a table for mounting a printed circuit board;
   electrode means for soldering the integrated circuit leads to the printed circuit board at a predetermined location on the table;
   means for positioning the integrated circuits on the printed circuit board at the predetermined location for soldering by the electrode means;
   means for intermittently moving the table with respect to the electrode means to position different areas of the printed circuit board at the predetermined location beneath the electrode means; and
   means for transporting the integrated circuits from the dispensing means to the lead-forming means and to the table;
   the improvement in the integrated circuit transporting means comprising:
     a continuous conveyor having a plurality of spaced support means for supporting and retaining integrated circuits by their leads; and
     means for forming feet on the integrated circuit leads while the integrated circuit is supported by the support means.

27. An apparatus for assembling integrated circuits according to claim 26 wherein the support means are made of magnetic material whereby the leads are magnetically retained by the support means.

28. In an apparatus for assembling integrated circuits having a body and a plurality of leads extending therefrom onto a printed circuit board comprising a plurality of solder-containing pads designed to receive the integrated circuit leads, wherein the leads of the integrated circuits are tinned and bent downwardly and laterally to form feet to contact the printed circuit pads;
   a table for mounting a printed circuit board;
   electrode means for soldering the integrated circuit leads to the printed circuit board at a predetermined location on the table;
   means for positioning the integrated circuits on the printed circuit board at the predetermined location for soldering by the electrode means; and
   means for intermittently moving the table with respect to the electrode means to position different areas of the printed circuit board at the predetermined location beneath the electrode means;
   the improvement in the table comprising electromagnetic holding means and ferromagnetic means retained by the electromagnetic holding means for holding the circuit boards.

29. An apparatus for assembling integrated circuits according to claim 28 wherein the ferromagnetic means comprises at least two separate support members having a pin for engaging a hole in the circuit board.

30. An apparatus for assembling integrated circuits according to claim 29 and further comprising a support for engaging an edge of the circuit board.

31. An apparatus for assembling integrated circuits according to claim 29 wherein the ferromagnetic means comprises a photocell coupled electromagnet in close proximity to each other; and control means to actuate the electromagnet only if the photocell is covered.

32. An apparatus for assembling integrated circuits according to claim 28 and further comprising means to energize the electromagnetic holding means to achieve a low level of residual magnetism to allow positioning of the ferromagnetic holding means and means to energize the electromagnetic holding means to achieve a high level of magnetism to firmly hold the ferromagnetic means.

33. A method of assembling flat pack integrated circuits having a body and a plurality of outwardly extending leads onto circuit boards comprising a plurality of solder-containing pads, the method comprising the steps of:

dispensing flat packs seriatim;

gripping the flat packs as they are dispensed by the leads thereof and while the flat packs are gripped by the leads:

bending the leads downwardly and outwardly of the body to form feet for mounting the integrated circuits on the circuit board; and applying solder to said feet; and thereafter soldering the leads to pads on the circuit board.

34. A method of assembling flat pack integrated circuits according to claim 33 wherein the leads are magnetically gripped during the lead-bending and solder-applying steps.

35. A method of assembling flat pack integrated circuits according to claim 34 and further comprising the step of transferring the integrated circuits with solder-containing leads to the circuit board while magnetically gripping the integrated circuits by the leads thereof.

36. A method of assembling flat pack integrated circuits according to claim 33 wherein the leads are continuously magnetically gripped from the dispensing step through the bending and solder applying steps.

37. A method of assembling flat pack integrated circuits according to claim 33 and further comprising the step of applying flux to the integrated circuit leads while they are gripped and prior to the solder-applying step.

38. A method of assembly flat pack integrated circuits according to claim 33 wherein the leads are continuously magnetically gripped from the dispensing step through the soldering step.

* * * * *